(12) United States Patent
Nakaya et al.

(10) Patent No.: US 7,659,769 B2
(45) Date of Patent: Feb. 9, 2010

(54) SEMICONDUCTOR DEVICE

(75) Inventors: Hiroaki Nakaya, Kokubunji (JP);
Satoru Akiyama, Sagamihara (JP);
Tomonori Sekiguchi, Tama (JP);
Riichiro Takemura, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 242 days.

(21) Appl. No.: 11/771,779

(22) Filed: Jun. 29, 2007

(65) Prior Publication Data

US 2008/0054262 A1   Mar. 6, 2008

(30) Foreign Application Priority Data

Aug. 31, 2006   (JP)   .............................. 2006-234896

(51) Int. Cl.
*G05F 1/10* (2006.01)
(52) U.S. Cl. ................................................ 327/534
(58) Field of Classification Search ................ 327/530, 327/534, 535, 537
See application file for complete search history.

(56) References Cited

U.S. PATENT DOCUMENTS

| | | | | |
|---|---|---|---|---|
| 4,435,652 A | * | 3/1984 | Stevens | 327/541 |
| 5,397,934 A | * | 3/1995 | Merrill et al. | 327/537 |
| 5,682,118 A | * | 10/1997 | Kaenel et al. | 327/534 |
| 6,518,827 B1 | * | 2/2003 | Fifield et al. | 327/534 |
| 7,138,851 B2 | * | 11/2006 | Sumita et al. | 327/534 |
| 7,196,571 B2 | * | 3/2007 | Sumita | 327/534 |
| 7,221,211 B2 | * | 5/2007 | Sumita et al. | 327/534 |
| 7,425,861 B2 | * | 9/2008 | Egerer et al. | 327/534 |
| 7,498,865 B2 | * | 3/2009 | Sakiyama et al. | 327/534 |
| 2005/0052219 A1 | | 3/2005 | Butler et al. | |
| 2005/0116765 A1 | * | 6/2005 | Sakiyama et al. | 327/534 |

FOREIGN PATENT DOCUMENTS

JP   2005-86819 A   3/2005

* cited by examiner

*Primary Examiner*—Jeffrey S Zweizig
(74) *Attorney, Agent, or Firm*—Miles & Stockbridge P.C.

(57) ABSTRACT

A substrate voltage control technique that prevents the operating speed from being decreased and suppresses a leakage current due to a lower threshold voltage with respect to a low voltage use. Since a center value of the threshold voltages is detected by plural replica MOS transistors, and a substrate voltage is controlled to control a center value of the threshold voltages, thereby making it possible to satisfy a lower limit of the operating speed and an upper limit of a leakage current of the entire chip. On the other hand, the substrate voltage is dynamically controlled during the operation of the chip, thereby making it possible to decrease the center value of the threshold voltages when the chip operates to improve the speed, and to increase the center value of the threshold voltages after the operation of the chip to reduce the leakage current of the entire chip.

14 Claims, 23 Drawing Sheets

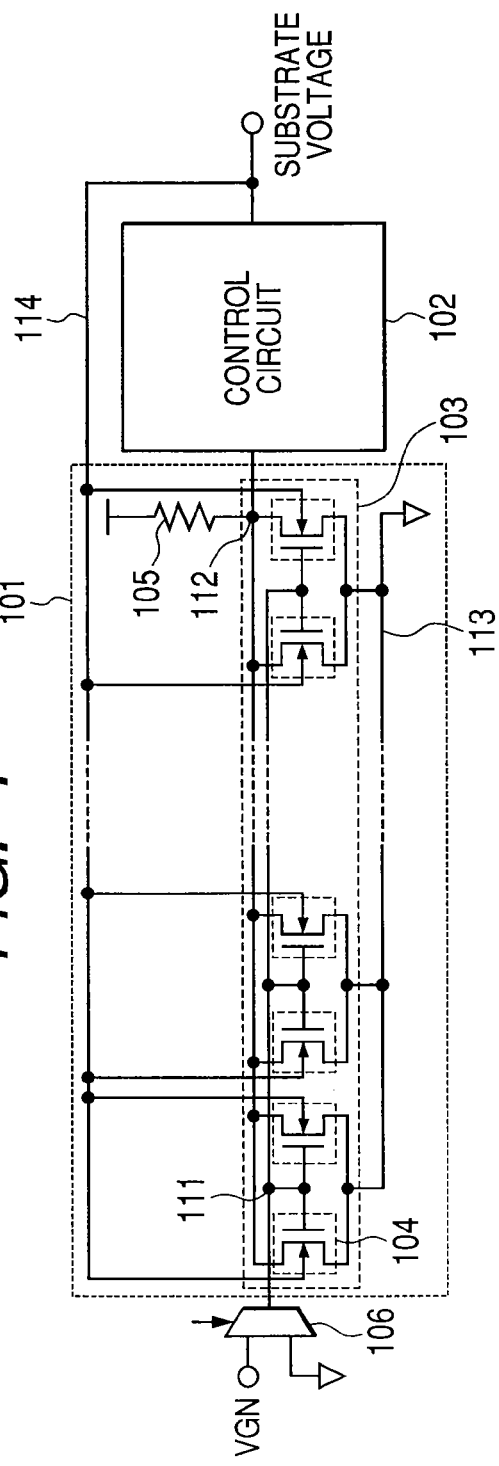
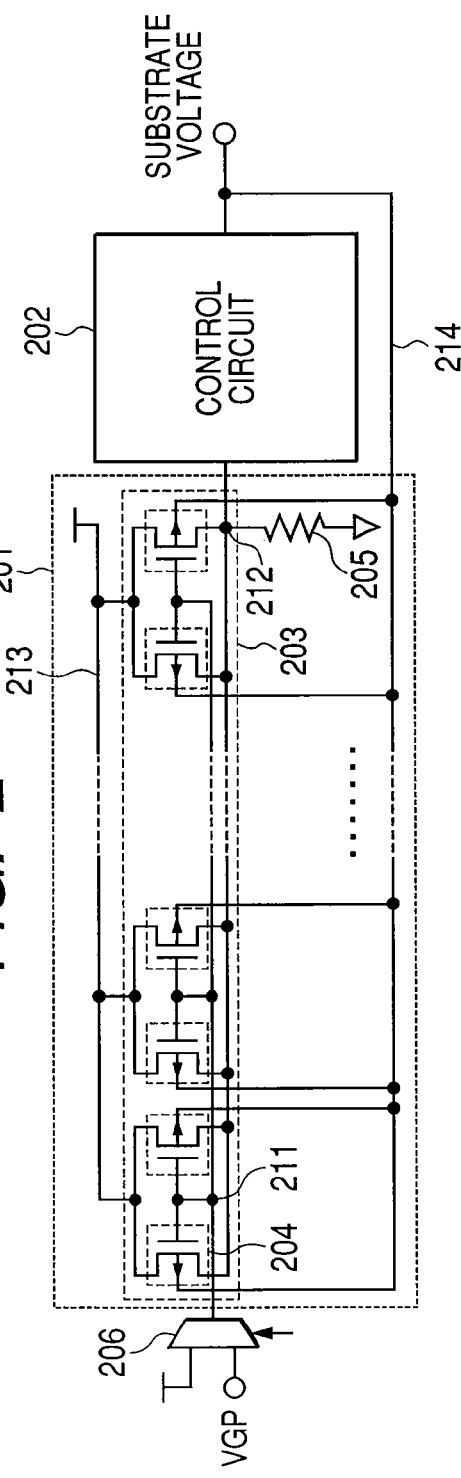

SEMICONDUCTOR DEVICE

CLAIM OF PRIORITY

The present application claims priority from Japanese application JP 2006-234896 filed on Aug. 31, 2006, the content of which is hereby incorporated by reference into this application.

FIELD OF THE INVENTION

The present invention relates to a semiconductor device, and more particularly to a semiconductor memory device that is effective in reducing a variation in a threshold voltage of a sense amplifier of the semiconductor memory device, and a control method therefor.

BACKGROUND OF THE INVENTION

According to the studies of the present inventors, there have been proposed the following control technique for the semiconductor device.

For example, dynamic random access memories (hereinafter referred to as "DRAM") that is one of the semiconductor devices have been incorporated in large numbers into diverse electronic devices that are used by us usual day. Also, with the low power consumption of the devices and the needs for the high performance in recent years, the high performance such as the lower power, the higher speed, or the higher capacity has been strongly demanded for the incorporated DRAM.

One of the most effective means for realizing the high-performance DRAM is to miniaturize memory cells. The miniaturization makes it possible to reduce the memory cell in sizes. As a result, the respective lengths of word lines and data lines which are connected to the memory cells are shortened, thereby making it possible to reduce the parasitic capacitance of the word lines and the data lines. Accordingly, the low-voltage operation can be conducted, and the low power consumption can be realized. Also, since the memory cell is reduced in the size, the capacity of the memory can be increased, and the higher performance of the device can be realized. In this way, the miniaturization greatly contributes to the higher performance of the DRAM.

However, as the nodes of 65 nm and 45 nm are progressively miniaturized, not only the advantage of the above-mentioned high performance but also diverse adverse effects are developed. The main adverse effects are to increase the variation of the device characteristics which are produced by the miniaturization. In the present specification, the variation in the device characteristics is directed to, for example, a dispersion value (deviation from a mean value) of a threshold voltage of a transistor, or the magnitude of a leakage current that flows from the transistor. The device variation causes the deterioration in the performance of the DRAM, it is desirable to suppress the device variation as much as possible. In particular, because the threshold voltage of the transistor that is used in the sense amplifier greatly influences on the operating speed of the DRAM, and influences the power consumption performance when the DRAM stands by, it is strongly desirable to reduce the variation of the threshold voltage.

In order to reduce the variation in the threshold voltage of the transistor that is used in the sense amplifier, it is necessary to reduce the manufacturing error in the channel length or the channel width. However, a tendency is made to increase the manufacturing error as the miniaturization is advanced, and it is difficult to reduce the manufacturing error more than that in the conventional art, and to reduce the variation in the threshold voltage. In other words, a variation in the threshold voltage of the cell transistor due to the short channel effect is increased year by year. When it is assumed that the variation in the threshold voltage has a regular distribution, the variation (a standard deviation $\alpha$) increases, and when the memory capacity (population parameter) is increased, the threshold voltage of the sense amplifier transistor under the worst conditions is necessarily lowered (or heightened). For that reason, the control for setting the substrate voltage deeply (or shallowly) so as to ensure the conditions of the sense speed and the power consumption is essential even under the condition of the threshold voltage of the worst sense amplifier transistor when the threshold voltage that is lowered by the short channel effect is assumed.

As the substrate voltage control technique described above, a technique disclosed in JP-A No. 2005-86819 has been proposed. JP-A No. 2005-86819 discloses a technique by which the substrate voltage of the transistor is controlled to change the threshold voltage in order to hold the circuit speed constant with respect to the process, the supply voltage, and the temperature variation. The threshold voltage is so changed as to reduce the variation in the threshold voltage and hold the operating speed of the transistor constant. Also, in the high-temperature or low-threshold voltage process condition, the threshold voltage is so increased as to reduce the leakage current.

SUMMARY OF THE INVENTION

Incidentally, as a result that the present inventors have studied the technique of manufacturing the above-mentioned semiconductor device, the present inventors have found the following facts.

With the lower power consumption of the DRAM, the lower voltage operation of the DRAM array has been progressively demanded year by year. As a result, a voltage that is applied to the bit lines of the DRAM is decreased. In the case where the sense amplifier of the DRAM uses a half pre-charge system, a voltage that is applied to the gates of an NMOS transistor and a PMOS transistor in the sense amplifier is also decreased when amplifying small data that has been stored in the bit line capacitor. As a result, a period of time required when the sense amplifier amplifies the data, and the operation of the DRAM is broken. For that reason, unless the voltage that is applied to the respective MOS transistors of the sense amplifier is increased, it is necessary that the threshold voltage of the MOS transistor is lowered to ensure the effective voltage that is applied to the gate.

JP-A 2005-86819 discloses a system that controls the threshold voltage of the MOS transistor, and ensures the driving force of the transistor. In order to control the threshold voltage of the MOS transistor, the system disclosed in JP-A 2005-86819 monitors the threshold voltage of one replica MOS transistor, and control the substrate voltage of the MOS transistor on the basis of the monitor result, to thereby control the threshold voltage. However, in that system, because the number of replica MOS transistors is one, there arises such a problem that a precision of the threshold voltage control is lacked.

More specifically, because a large number of sense amplifier MOS transistors of the DRAM are disposed on the chip, it is impossible to grasp a variation in the threshold voltages of the transistor by one replica MOS transistor. For that reason, in the case where a transistor that is very high in the threshold voltage or a transistor that is very low in the threshold voltage is the replica MOS transistor with respect to a transistor that exists in the center of the threshold voltage distribution, there is the possibility that the threshold voltage of the sense amplifier MOS transistor is remarkably decreased or remarkably increased on the basis of the monitor results. The erroneous threshold voltage control induces such problems that the sense speed is decreased and the power consumption is increased.

Under the above circumstances, the present invention has been made in view of the above problems, and therefore an object of the present invention is to provide a control method and a manufacturing method for realizing a semiconductor device which grasps the distribution of the threshold voltage of the sense amplifier transistor and controls the substrate voltage taking the variation in the threshold voltage into consideration so as to suppress the sense speed deterioration and reduce the power consumption.

The above object, other objects, and novel features of the present invention will become apparent from the description of the present specification and the attached drawings.

The representative outline of the present invention described in the present application will be briefly described below.

In the control method for the semiconductor device according to the present invention, a large number of replica MOS transistors that monitor the threshold voltages of the sense amplifier are disposed on a DRAM chip, and the substrate voltage is determined on the basis of the monitor results including not only the threshold voltages of the transistors but also a variation in the threshold voltages.

The advantages obtained by the representative features of the present invention described in the present application reside in that it is possible to suppress a decrease in the sense speed or realize the lower power consumption.

BRIEF DESCRIPTION OF THE DRAWINGS

These and other objects and advantages of this invention will become more fully apparent from the following detailed description taken with the accompanying drawings in which:

FIG. 1 is a diagram illustrating an entire NMOS substrate control block;

FIG. 2 is a diagram illustrating an entire PMOS substrate control block;

DETAILED DESCRIPTION OF THE PREFERRED EMBODIMENTS

Figure 3:
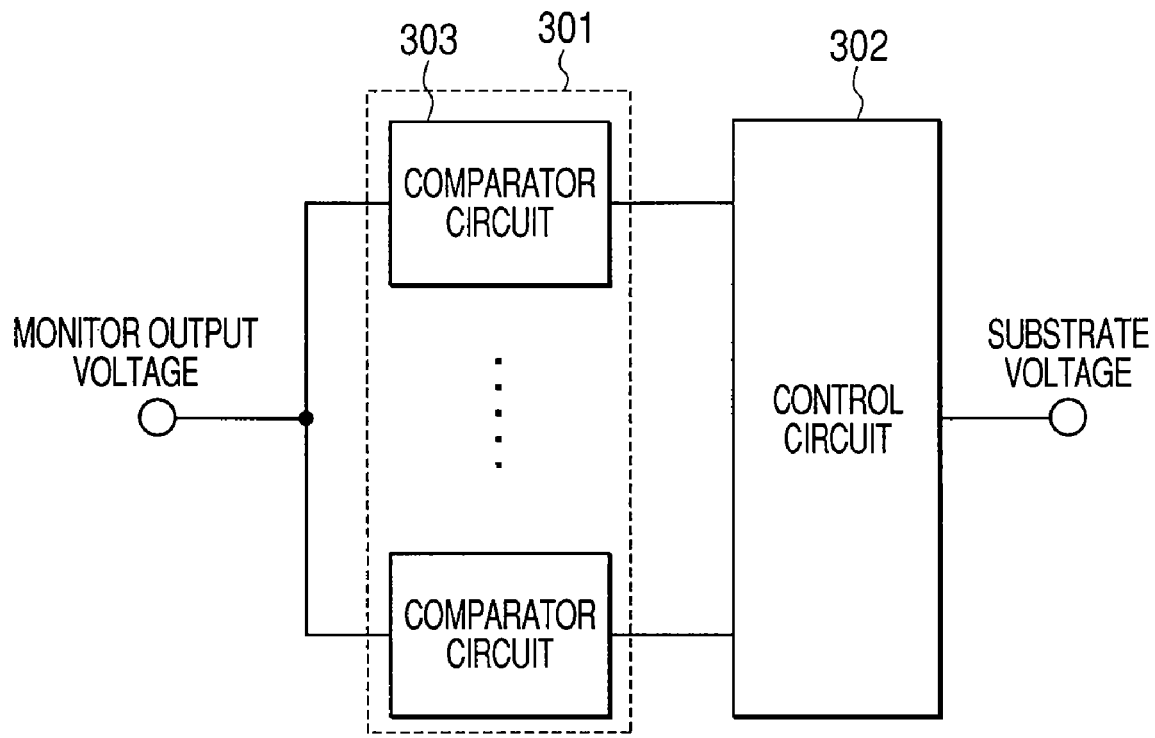
FIG. 3 is a diagram showing a substrate voltage control circuit.

Hereinafter, a description will be given in more detail of preferred embodiments of the present invention with reference to the accompanying drawings. In all of the drawings for explaining the various embodiments, the same members are indicated by identical references in principle, and their duplex description will be omitted.

Also, transistors that constitute the respective blocks shown in the respective embodiments are formed on one semiconductor substrate made of single crystal silicon by an integrated circuit technique of a known CMOS (complementary MOS transistor) although being not particularly limited. That is, the transistors are formed by a step of forming first and second semiconductor regions that constitute a gate electrode and a source/drain region after a step of forming a well, an element separation region, and an oxide film.

A circuit symbol of a MOSFET (metal oxide semiconductor field effect transistor) represents an n-type MOSFET (NMOS) when an arrow is directed outward with respect to a gate, which is distinguishable over a p-type MOSFET (PMOS) whose arrow is directed inward with respect to the gate. Hereinafter, the MOSFET is called "MOS" or "MOS transistor" for simplification.

The present invention is not limited to only a field effect transistor including an oxide film that is disposed between a metal gate and a semiconductor layer, but also applied to a circuit using a general FET such as an MISFET (metal insulator semiconductor field effect transistor) including an insulating film therebetween. The MOS transistor includes an MISFET unless otherwise noted.

First Embodiment

Hereinafter, a semiconductor device according to one embodiment of the present invention will be described with reference to FIGS. 1 to 5.

FIG. 1 is a block diagram showing an entire NMOS transistor substrate control circuit. The NMOS transistor substrate control circuit is roughly classified into two circuits. One circuit is a sense amplifier NMOS transistor threshold voltage monitoring circuit 101, and another circuit is a control circuit 102.

The NMOS transistor threshold voltage monitoring circuit 101 includes a replica NMOS transistor array 103 and a resistor 105. The replica NMOS transistor array 103 is composed of plural replica NMOS transistors 104. All gate terminals of those plural replica NMOS transistors 104 are connected to a node 111, all drain terminals thereof are connected to a node 112, all source terminals thereof are connected to a node 113, and all substrates are connected to a node 114. The node 111 is input with a gate input voltage VGN. The gate input voltage VGN is input with a voltage between a supply voltage (VCC) and a ground voltage. In particular, in this embodiment, in order to control the substrate of the sense amplifier NMOS transistor, a bit line precharge voltage (half voltage of the bit line voltage) which is a voltage at the time of starting the operation of the sense amplifier NMOS transistor is input as the gate input voltage VGN. The node 113 is connected with a circuit ground. The resistor 105 has one end connected to a supply voltage (VCC) and another end connected to the node 112. Also, the node 112 is connected to an input of the control circuit. The node 114 is connected to an output of the control circuit. In this specific embodiment, the number of replica NMOS transistors is N, and the resistor 105 has such a resistance that the node 112 has substantially the half voltage (½ VCC) of the supply voltage.

The voltage at the node 112 is determined according to the replica NMOS transistor array 103. The respective threshold voltages of the replica NMOS transistors 104 within the replica NMOS transistor array 103 are different from each other because of the element variation. When the gate input voltage VGN is applied to the node 111, currents corresponding to the respective threshold voltages flow in the respective replica NMOS transistors. The voltage at the node 112 is determined according to the total of currents that flow in the respective replica NMOS transistors. That is, the node 112 has a voltage corresponding to the center of the threshold voltages of the plural replica NMOS transistors 104.

The control circuit 102 compares the voltage at the node 112 with a reference voltage, and controls the threshold voltages of the replica NMOS transistor and the NMOS transistor of the sense amplifier. The control circuit receives the voltage at the node 112, internally compares the received voltage with the reference voltage, and determines the substrate voltage (node 114) for setting the threshold voltages of the replica NMOS transistors and the NMOS transistors of the sense amplifier to output the set substrate voltage. The substrate voltage of the replica NMOS transistor changes when the substrate voltage (node 114) changes, to thereby change the threshold voltages of the replica NMOS transistors. As a result the voltage at the node 112 also changes. The control circuit 102 again changes the substrate voltage due to the changed voltage at the node 112. In this way, the control circuit determines an appropriate substrate voltage while gradually changing the substrate voltage that is applied to the NMOS transistor.

FIG. 2 is a diagram showing an entire PMOS transistor threshold voltage control block. The PMOS transistor threshold voltage control circuit is roughly classified into two circuits. One circuit is a sense amplifier PMOS transistor threshold voltage monitoring circuit 201, and another circuit is a control circuit 202.

The PMOS transistor threshold voltage monitoring circuit 201 is composed of a replica PMOS transistor array 203 and a resistor 205. The replica PMOS transistor array is composed of plural replica PMOS transistors 204. All gate terminals of those plural replica PMOS transistors 204 are connected to a node 211, all drain terminals thereof are connected to a node 212, all source terminals thereof are connected to a node 213, and all substrates are connected to a node 214. The node 211 is input with a gate input voltage VGP. The gate input voltage VGP is input with a voltage between the supply voltage (VCC) and the ground voltage. In particular, in this embodiment, in order to control the substrate of the sense amplifier PMOS transistor, the bit line presearch voltage (half voltage of the bit line voltage) that is a voltage at the time of starting the operation of the sense amplification PMOS transistor is input as the gate input voltage VGP. That is, in this embodiment, the gate input voltages VGN and VGP can be set to the same voltage, and it is unnecessary to increase the number of power supply circuits. The node 213 is connected with the supply voltage (VCC). The resistor 205 has one end connected to a circuit ground and another end connected to the node 212. Also, the node 212 is connected to an input of the control circuit. The node 214 is connected to an output of the control circuit. In this specific embodiment, the number of replica PMOS transistors is N, and the resistor 205 has such a resistance that the node 212 has substantially the half voltage (½ VCC) of the supply voltage.

The voltage at the node 212 is determined according to the replica PMOS transistor array 203. The respective threshold voltages of the replica PMOS transistors 204 within the replica PMOS transistor array 203 are different from each other because of the element variation. When the gate input voltage VGP is applied to the node 211, currents corresponding to the respective threshold voltages flow in the respective replica PMOS transistors. The voltage at the node 212 is determined according to the total of currents that flow in the respective replica PMOS transistors. That is, the node 212 has a voltage corresponding to the center of the threshold voltages of the plural replica PMOS transistors 204.

The control circuit 202 compares the voltage at the node 212 with a reference voltage, and controls the threshold voltages of the replica PMOS transistors and the PMOS transistors of the sense amplifier. The control circuit receives the voltage at the node 212, internally compares the received voltage with the reference voltage, and determines the substrate voltage (node 214) for setting the threshold voltages of the replica PMOS transistors and the PMOS transistors of the sense amplifier to output the set substrate voltage.

FIG. 3 is a diagram showing an internal configuration of the control circuit 102 and the control circuit 202. Each of the control circuits is roughly classified into two circuits, that is, a comparator circuit array 301 and a power supply circuit 302. Plural comparator circuits 303 are included in the interior of the comparator circuit array 301. The comparator circuit array 301 compares a voltage (monitor output voltage) that is set by the pre-stage sense amplifier NMOS (PMOS) threshold voltage monitoring circuit with a reference voltage. The reference voltage is different in each of the comparator circuits, and has a given range of from a lower reference voltage to a higher reference voltage. The respective comparator circuits 303 within the comparator circuit array 301 compare inputted voltages (monitor output voltage) with the reference voltages, and output the comparison results to the power supply circuit 302. The power supply circuit 302 outputs the substrate voltage on the basis of the results from the comparator circuit array 301.

Figure 4:
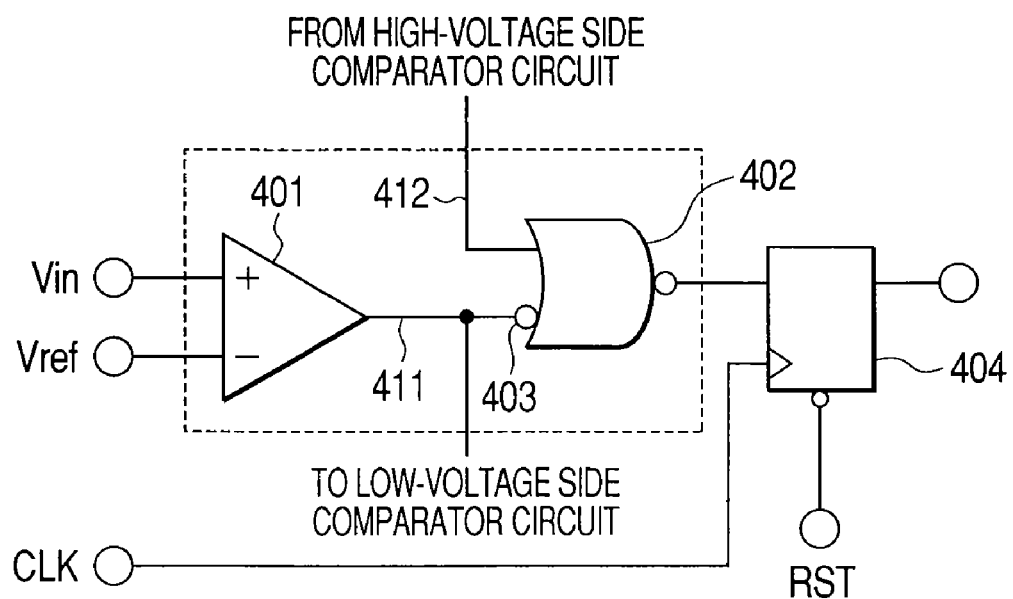
FIG. 4 is a diagram showing a comparator circuit.

FIG. 4 is a diagram showing the configuration of the comparators 303 within the comparator circuit array 301. Each of the comparator circuits 303 is composed of a differential amplifier 401, INV-NOR gates 402, 403, and a flip-flop circuit 404. The comparator circuit 303 compares an input voltage Iin that is a monitor output voltage with a reference voltage Vref to determine the substrate voltage. First, the differential amplifier 401 compares the input voltage Vin with the reference voltage Vref, and outputs a high-level signal in the case where the input voltage Vin exceeds the reference voltage Vref (node 411). When the high-level signal is inputted to an input terminal (node 411) of the INV-NOR gate 402, the high-level signal is inverted into a low-level signal by the INV gate 403 and input to the NOR gate 402. In this situation, in the case where the output node 412 from the comparator circuit 303 at the higher voltage side, the output of the INV-NOR gate, that is, the output of the comparator circuit becomes unqualifiedly low. However, in the case where the node 412 is low, the output of the INV-NOR gate, that is, the output of the comparator circuit becomes high. Also, in the case where the input voltage Vin is lower than the reference voltage Vref, the low-level signal is outputted (node 411). When the low-level signal is input to the input (node 411) of the INV-NOR gate 402, the low-level signal is inverted into the high-level signal by the INV gate 403 and input to the NOR gate. In this situation, the output of the INV-NOR gate, that is, the output of the comparator circuit becomes unqualifiedly low regardless of the output node 412 from the comparator circuit at the higher voltage side. Also, the flip-flop circuit 404 takes in and holds the output of the NOR gate at the time of a change in the clock signal CLK, and outputs the comparison results to the post-stage power supply circuit 302.

Figure 5:
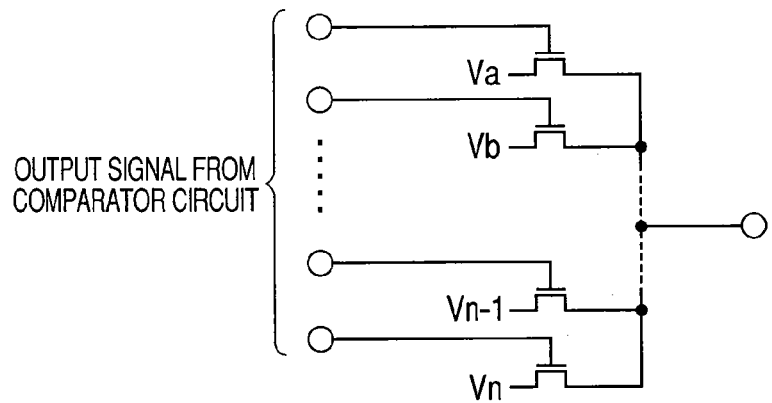
FIG. 5 is a diagram showing a power supply circuit.

FIG. 5 is a diagram showing the configuration of the internal of the power supply circuit 302. The power supply circuit 302 is composed of plural NMOS transistors, and the respective drain terminals of the plural NMOS transistors are set to different voltages. Only one high-level signal is outputted from the comparator array 301. The output is inputted to the gate of the NMOS, and a voltage that is connected to the drain terminal of the NMOS is outputted as the substrate voltage.

In the case where the substrate voltage is not adjusted by the substrate control circuit, the gate input voltage of the replica MOS transistor in the monitoring circuit is set to the ground voltage in the case of the NMOS and the supply voltage VCC in the case of the PMOS. As a result, an unnecessary DC path can be blocked, and a reduction in the power consumption can be realized. However, the nodes 112 and 212 approach the supply voltage VCC or the ground voltage through the resistor. Under the circumstances, the operation of the differential amplifier 401 shown in FIG. 3 is stopped, and the substrate voltage to be supplied is held constant according to the information that is held by the flip-flop circuit 404without changing the clock signal CLK. In this way, the power supply block of the substrate control circuit is realized.

Subsequently, a description will be given of the physical configuration of the semiconductor device according to one embodiment of the present invention with reference to FIGS. 6 to 10.

Figure 6:
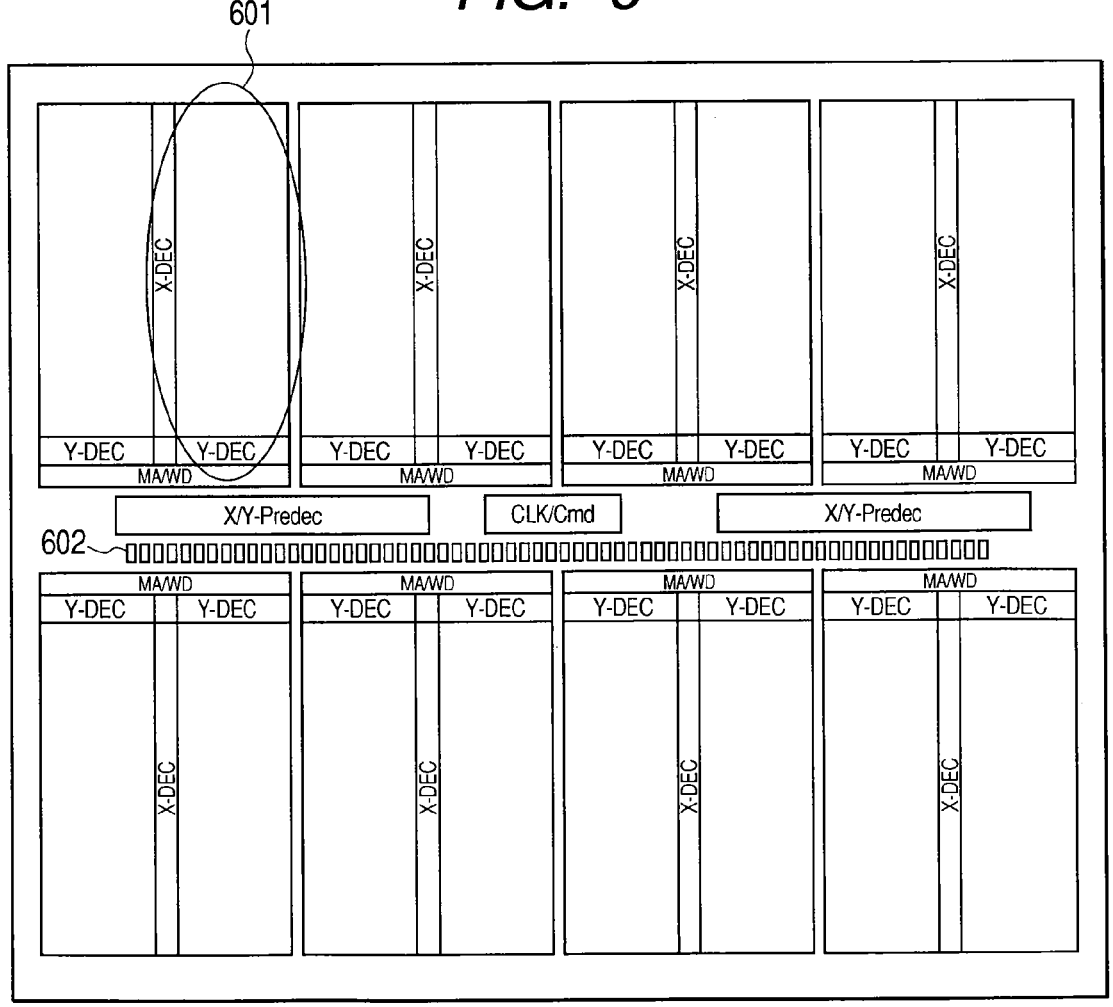
FIG. 6 is a diagram showing an entire DRAM chip.

FIG. 6 is a diagram showing the entire chip configuration of the DRAM. The DRAM chip is entirely roughly classified into a control circuit (X/Y-Predec, CLK/Cmd), a memory block 601, and an input/output PAD 602. The control circuit (X/Y-Predec, CLK/Cmd) is inputted with a clock signal, an address signal, and a control signal from the external of the chip to determine the operating mode of the chip or predecode the address. The input/output PAD 602 is inputted with write data, and outputs read data to the external of the chip. The control circuit includes an X-decoder X-DEC, a Y-decoder Y-DEC, a predecoder X/Y-Predec, a command decoder CLK/Cmd, a main amplifier MA, and a word driver WD.

Figure 7:
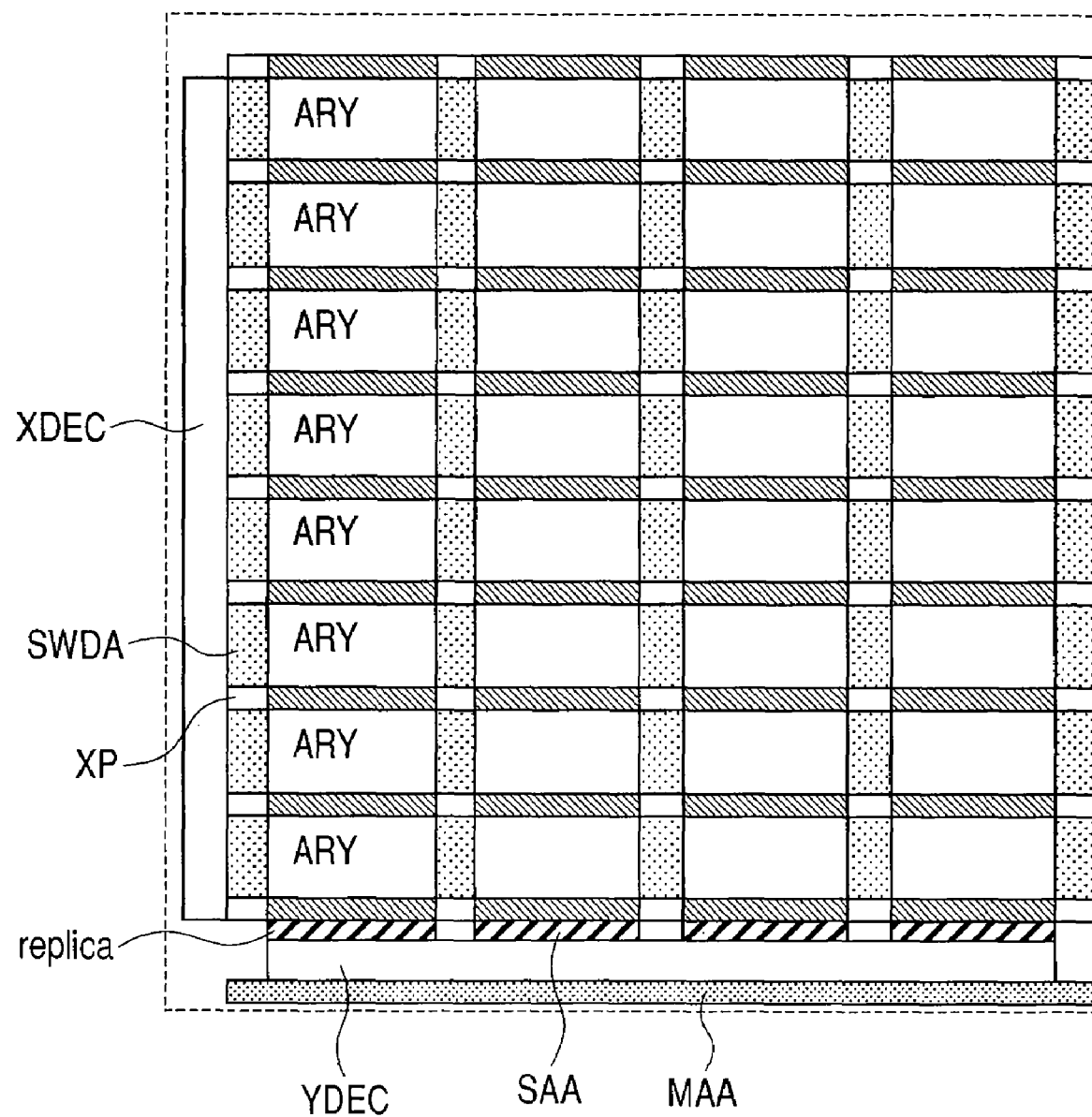
FIG. 7 is a diagram showing a DRAM block.

The configuration of the memory block 601 is shown in FIG. 7. Plural memory cell arrays ARY that are arranged in arrays are disposed in the memory block, and a sense amplifier array SAA, a sub-word driver array SWDA, and a cross area XP are disposed around the plural memory cell arrays ARY. Also, a replica array replica, a column decoder YDEC, and a main amplifier array MAA are disposed in parallel to the sense amplifier array in the outer periphery of the block, and a row decoder XDEC is disposed in parallel to the sub-word driver array. The replica MOS transistors shown in FIGS. 1 and 2 are disposed in the replica array replica.

Figure 8:
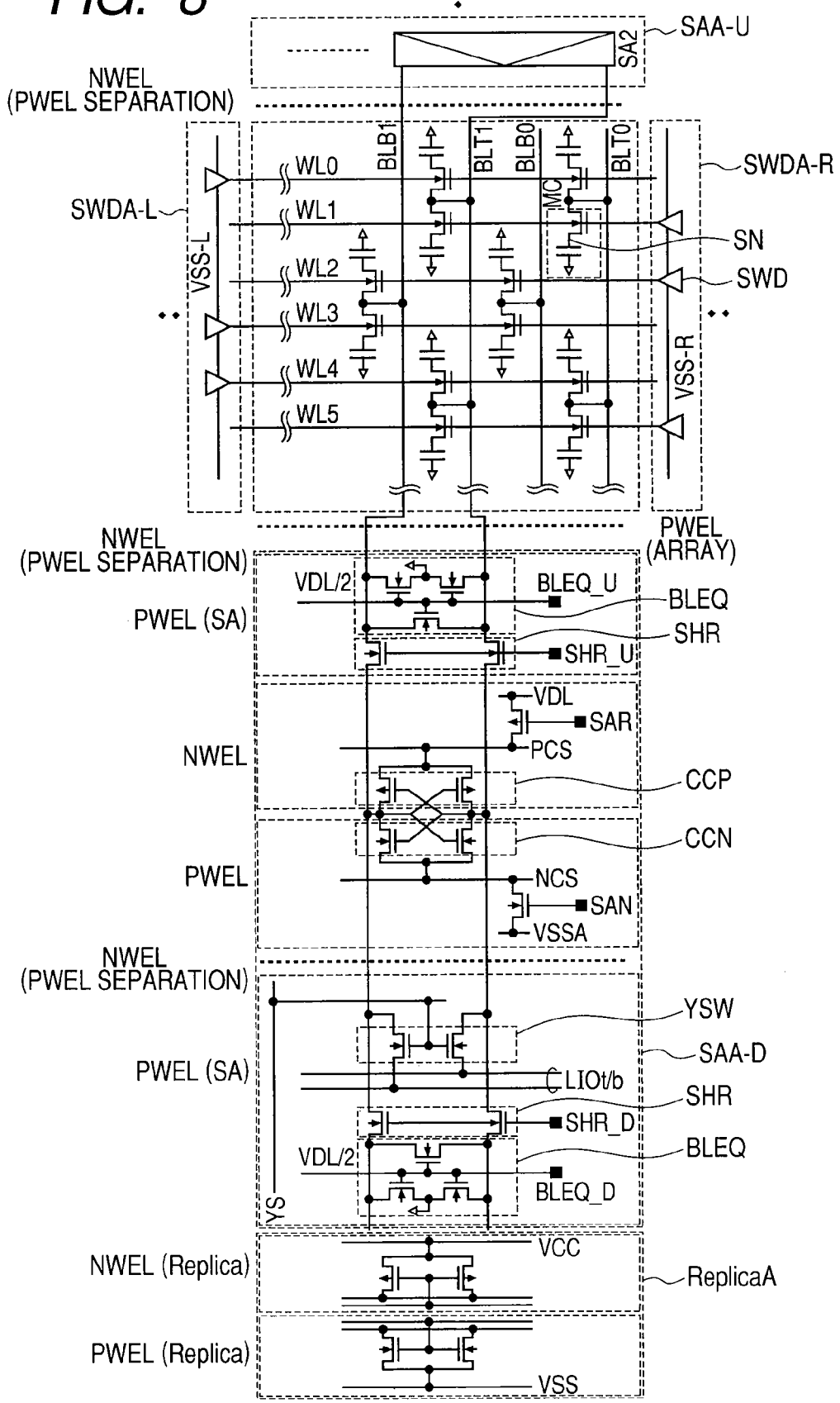
FIG. 8 is a diagram showing the well configuration of a sense amplifier and a replica MOS transistor.

FIG. 8 shows the memory cell array ARY, the sense amplifier array SAA, and the replica MOS transistor array Replica A. The memory cell array is composed of plural memory cells MC. The DRAM cell is composed of one MOS transistor and one capacitor, and one source terminal or drain terminal of the MOS transistor is connected to the bit line, another source terminal or drain terminal thereof is connected to a storage node SN, and a gate terminal thereof is connected to a word line. One terminal of the capacitor is connected to the storage node SN, and another terminal of the capacitor is connected to the circuit ground.

Plural sense amplifiers SA are disposed in the sense amplifier array, and connected to bit lines of both side arrays. A precharge circuit BLEG equalizes bit lines that are paired when precharge signals BLEQ_U/BLEQ_D are activated, and precharges the bit lines to a bit line precharge level. The bit line precharge level is normally set to a neutral point VDL/2 of the bit line amplitude VDL (the same level as the supply voltage VCC from the external of the chip or a level lower than the supply voltage VCC). After a minute read signal has been generated from the memory cell on the bit line, a cross couple amplifier CCP/CCN drives the P-side common source line CSP to the VDL, drives the N-side common source line CSN to VSS, and amplifies the higher voltage of the bit lines BLT and BLB to VDL, and the lower voltage to VSS. When a column selected line YS is activated, local IO lines LIOt/LIOb and a pair of bit lines are connected to each other. In order to prevent current consumption at the non-selected sense amplifier array, LIOt/b is precharged to the bit line precharge voltage (VBLR) at a standby time. Transistors that are identical in the configuration as the sense amplifier are disposed in parallel to the sense amplifier in the replica MOS transistor array.

Also, it is necessary to separate P wells PWELL from each other in order to supply the substrate voltage of the sense amplifier, independently. In this embodiment, although the NMOS cross couple CCN and YSW are of the same PWELL, a dummy N well NWELL is disposed between the P wells. No element is formed in the N well.

Figure 9:
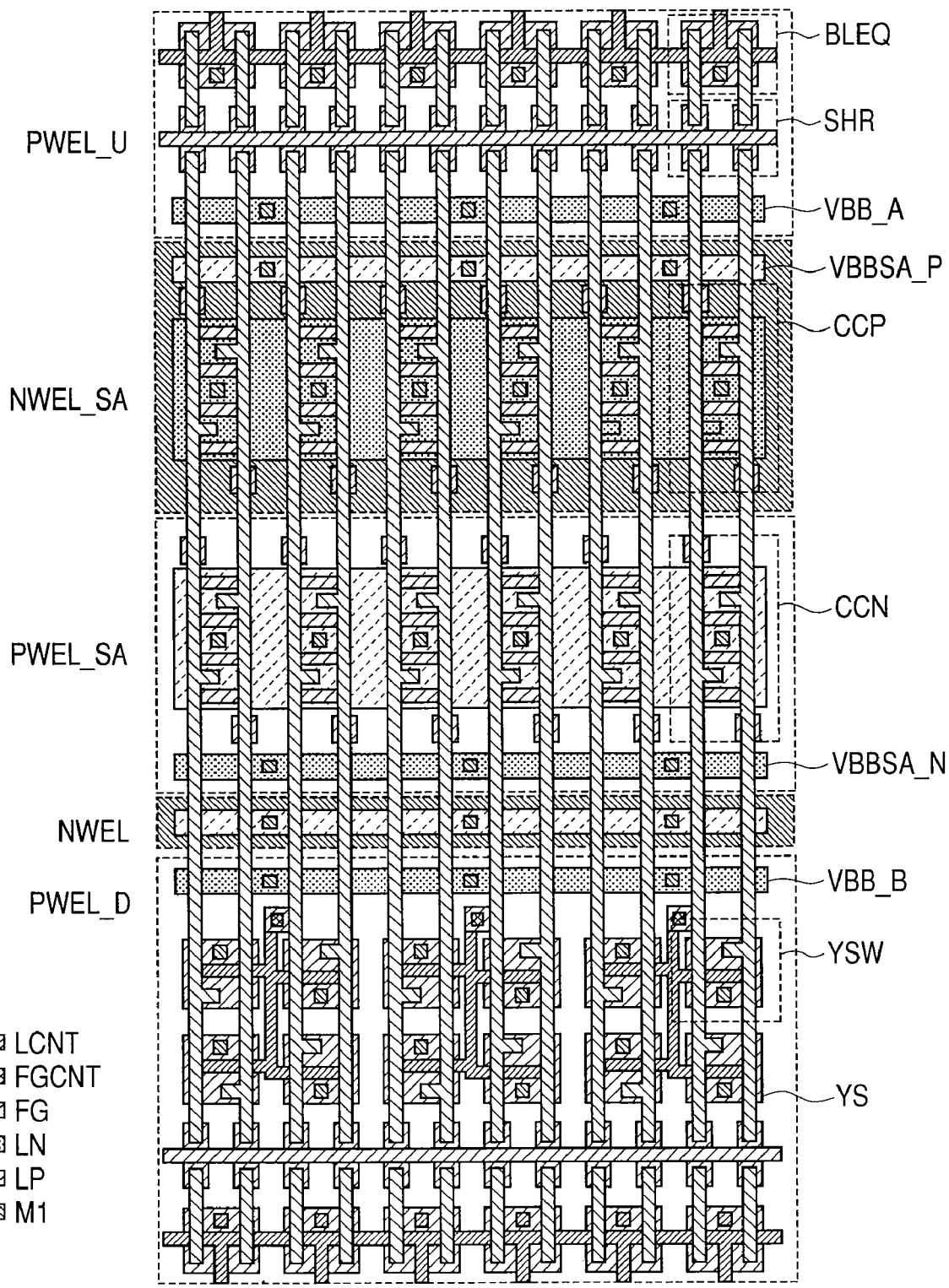
FIG. 9 is a diagram showing the layout of the sense amplifier.

FIG. 9 is a diagram showing a plan layout of the sense amplifier array. Parts of symbols indicative of dashed portions corresponds to the respective circuits that constitute the sense amplifier array SAA-D shown in FIG. 8, respectively. Also, larger frames indicated by dashed lines represent PWELs and NWELs, respectively. The PWELs are indicated by the larger dashed lines, and the NWELs are shaded within the larger dashed frame. Reference YS denotes a column switch drive line, and LIO denotes a local bit line. Also, in FIG. 9, symbol FGCNT denotes a gate contact that connects the gate electrode and a wiring layer M1 (bit line) of a first layer, LN and LP are diffused layers, FG is a gate electrode, and LCNT is a diffused layer contact that connects the diffused layers LN, LP and the wiring layer M1. The substrate voltage control conducted in the present invention is to control the voltage of the substrate VBBSA_P of the PMOS cross couple (CCP) and the voltage of the substrate VBBSA_N of the NMOS cross couple (CCN). That is, the voltages that are supplied to the substrate VBBSA_P and the substrate VBBSA_N are outputted from the substrate control circuit shown in FIG. 1 or 2. The layout diagram of FIG. 9 shows a case in which the substrate voltages (VBBSA_P and VBBSA_N) of the respective cross couples (CCP and CCN) are controlled, independently from other MOS transistors (for example, SHR or BLEQ). The NMOS cross couples CCN and YSW are of the same PWELL, and the NWEL is interposed therebetween to separate those NMOS cross couples CCN and YSW from each other. With the above configuration, only the substrate voltage VBBSA_N of the NMOS cross couple CCN can be controlled, independently. However, the WEL separation allows the layout area to increase. Although being not shown in FIG. 9, unless the WEL separation is conducted, not only the substrate voltage VBBSA_N of the NMOS cross couple CCN, but also the substrate voltages of the YSW, SHR, and BLEQ are controlled together. In this case, the layout area can be reduced. Also, the PMOS cross couple (CCP) and the NMOS cross couple (CCN) which constitute the sense amplifier are constituted by a so-called ring gate in order to ensure the driving force of the MOS transistor, which is different from other transistors.

Figure 10:
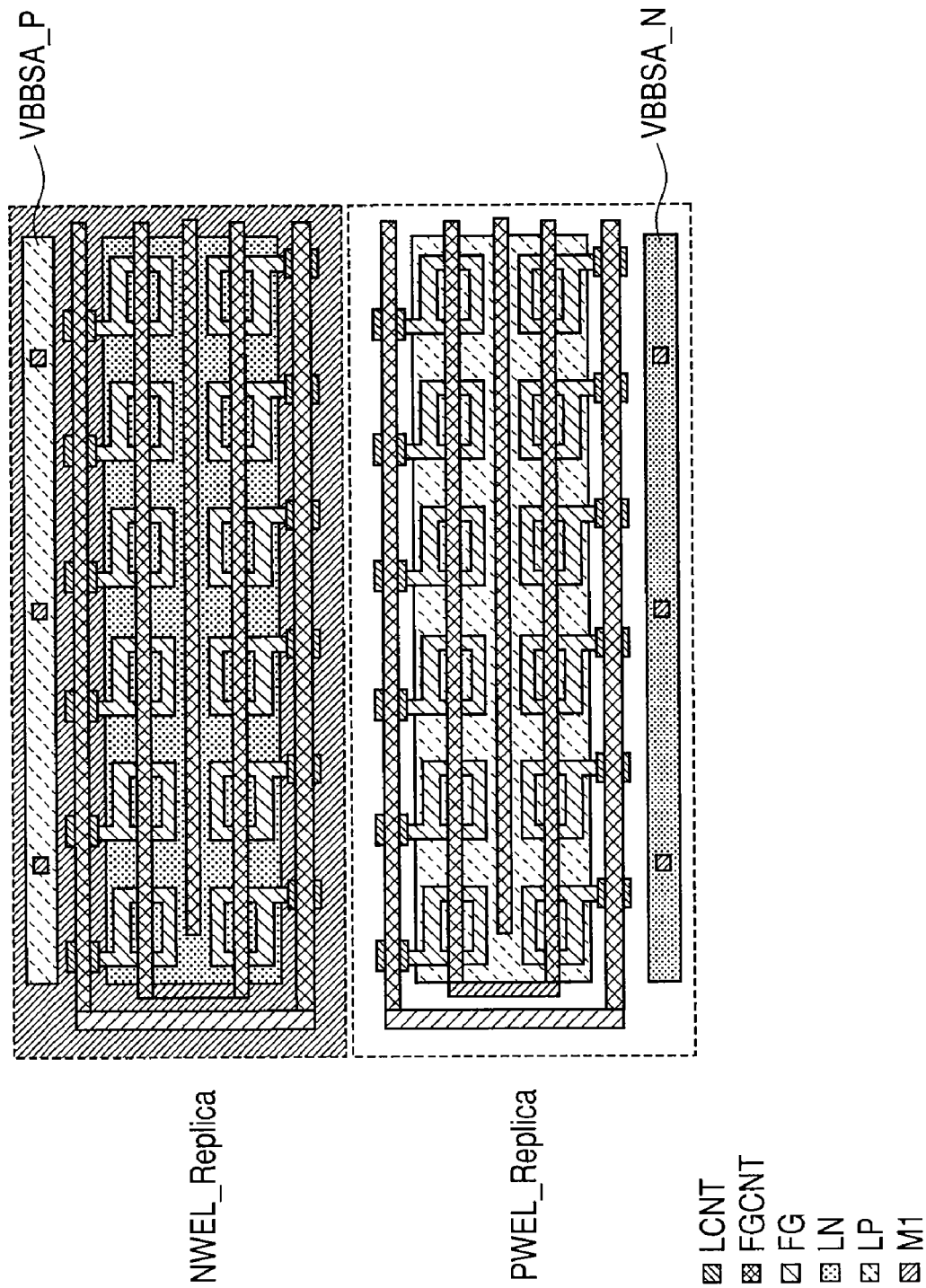
FIG. 10 is a diagram showing the layout of the replica MOS transistor.

FIG. 10 is a diagram showing a plan layout of the replica MOS transistor array. The configurations of the NMOS transistor and the PMOS transistor are of the same ring gate configuration as that the sense amplifier MOS transistor. As in the circuit configuration shown in FIG. 1, all of the gate terminals of the replica NMOS transistors are connected to M1 so as to connect to the same node, all of the drain terminals are connected to M1 so as to connect to the same node, and all of the source terminals are connected to M1 so as to connect to the same node. Likewise, all of the gate terminals of the replica PMOS transistors are connected to M1 so as to connect to the same node, all of the drain terminals are connected to M1 so as to connect to the same node, and all of the source terminals are connected to M1 so as to connect to the same node. Also, in FIG. 10, symbol FGCNT denotes a gate contact that connects the gate electrode and the wiring layer M1 (bit line) of the first layer, LN and LP are diffused layers, FG is a gate electrode, and LCNT is a diffused layer contact LCNT that connects the diffused layers LN, LP and the wiring layer M1. In order to conduct the substrate voltage control according to the present invention, the substrate voltages that are set by the control circuits 102 and 202 are inputted to the VBBSA_N and VBBSA_P from the outputs of the replica NMOS transistor and the replica PMOS transistor to confirm whether the set substrate voltages are desired values, or not. In this situation, in the case where additional adjustment is necessary, the substrate voltages that are set by the control circuits 102 and 202 are inputted to the VBBSA_N and VBBSA_P from the outputs of the replica NMOS transistor and the replica PMOS transistor to determine the results. The above operation is repeated to decide the substrate voltage VBBSA_N of the sense amplifier NMOS cross couple CCN and the substrate voltage VBBSA_P of the sense amplifier PMOS cross couple CCP shown in FIG. 9.

The substrate control operation can be conducted at roughly, for example, five stages. That is, the five stages consist of (1) a stage immediately after manufacturing the DRAM chip, (2) a stage when a power is supplied to the DRAM chip, (3) a stage when a mode register is set, (4) a stage when the mode transits to a test mode where the substrate control operation is conducted, and (5) a stage of the normal operation.

First, a description will be given of a case in which the substrate control operation is conducted immediately after manufacturing the DRAM chip of (1). The substrate control circuit operates to adjust the substrate voltage at the time of conducting a text immediately after manufacturing the DRAM chip. In the case where the substrate control operation is conducted immediately after manufacturing, it is necessary to store the adjusted result in a nonvolatile memory. Accordingly, it is necessary that the selector circuit 106 or 206 shown in FIG. 1 or 2 selects a fixed voltage by the aid of a known fuse or nonvolatile memory, and also the result when the reset signal RST is inputted to the flip-flop 404 shown in FIG. 4 is inputted.

Subsequently, a description will be given of a case in which a power is supplied to the DRAM chip not immediately after manufacturing the DRAM chip. In the case where the substrate control operation is conducted after the power is supplied to the DRAM chip, (2) a stage immediately after the power is supplied, (3) a stage when the mode register is set, and (4) a stage when the mode transits to the test mode are represented. In the case of (2) to (4), that one of (2) to (4) is selectively executed is enough, but as the occasion demands, the combination of (2) to (4) can be executed in plural times without any problem. Also, the adjustment period can be measured by a timer, or can be set to "since power supply till mode register setting" or "since mode register setting till an initial access". The importance is that it is necessary to ensure a sufficient time in order to adjust the substrate voltage. After the adjustment, the clock signal CLK shown in FIG. 4 is stopped, the information is held in the flip-flop circuit 404, the fixed voltage is selected by the selector circuit 106 or 206 shown in FIG. 1 or 2, and the operation of the monitoring circuit is stopped.

Also, it is possible to conduct the dynamic control in the normal operation. In the case of conducting the dynamic control, it is determined whether it is before or after the operation of the sense amplifier. In the case where it is before the sense amplifier operation, the substrate voltage is set to be shallower, and the threshold voltages of the NMOS and PMOS transistors of the sense amplifier are set to be lower, to thereby increase the sense speed. On the other hand, in the case where it is after the sense amplifier operation, the substrate voltage is set to be deeper, and the threshold voltage of the NMOS transistor of the sense amplifier is set to be higher, to thereby reduce the power consumption.

Figure 11:
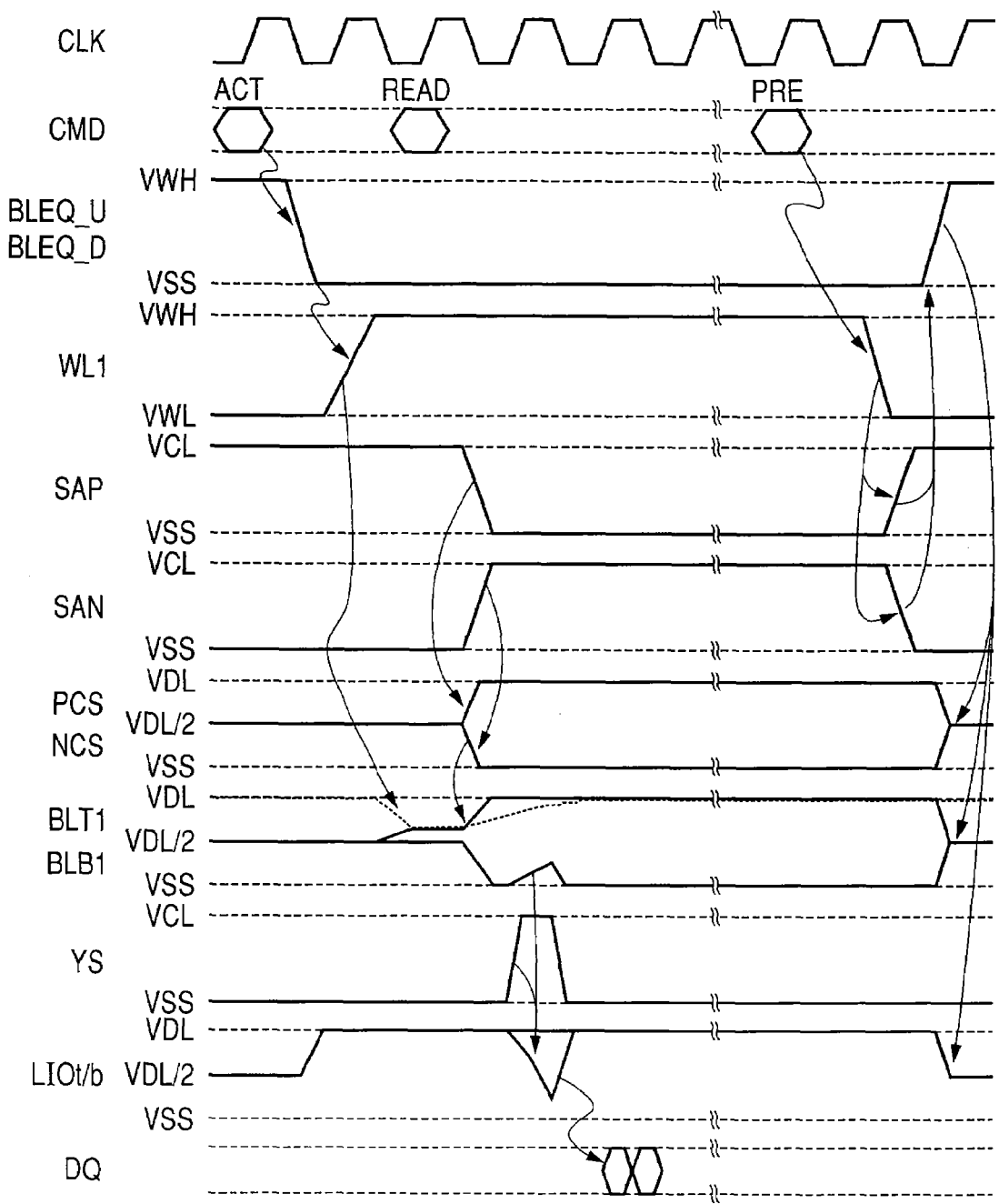
FIG. 11 is a timing chart showing an example of the reading operation waveforms of a synchronous DRAM to which the present invention is applied.

The memory array operation will be described with reference to FIG. 11. FIG. 11 is a timing chart showing an example of the reading operation waveforms of the semiconductor device to which the present invention is applied. When an active command ACT is inputted together with a low address, the address is decoded internally. As a result, in the sense amplifier block of the corresponding address, the bit line precharge signals BLEQ_U and BLEQ_D transit to a deactivated state. In this example, because the precharge circuit BLEQ is configured by NMOS, the bit line precharge signals transit from the higher voltage level of the activated state, for example, from a word line step-up power supply VWH or a bit lien amplitude voltage VDL to a ground level VSS. As a result, the precharge of the bit line of the corresponding memory cello array is stopped. Then, the word lien WL corresponding to the input address is selected. In this situation, as the selected word line, one word line that is connected to one memory cell, for example, WL1 of FIG. 8 is activated. Then, the activated word line WL1 transits from a word line standby level to a word line select level VWH. With this operation, in the memory cell MC, the gate of the transistor is selected, a storage node SN and the bit line are connected to each other, and the data in the memory cell is read by the bit line. This example shows a case in which data of "H" is saved in the memory cell storage node SN. In this situation, the bit line becomes higher in voltage as large as electric charges that have been stored in the storage node SN than the precharge level. In this situation, the NMOS sense amplifier activated signal NCS transits from the ground level VSS of the non-selected state to the higher voltage VDL of the activated state, or the word line voltage VWH a given period of time after the word line has been activated, to thereby activate the NMOS cross couple. Substantially at the same time, or late, the PMOS sense amplifier activated signal PCS transits from the higher voltage state VDL of the non-selected state or the word line voltage VWH to the ground level VSS of the activated state to activate the PMOS cross couple. As a result, a minute signal voltage that is developed in the bit line is amplified up to the bit line amplitude voltage. This state is a column command input waiting state. An actual column command can be input simultaneously when or before the bit line amplitude becomes sufficient. This example shows that a read command READ is inputted from the external. A column address to be read at the same time as the read command READ is inputted. Upon inputting the read command, the column select line YS transits from the ground level VSS of the standby state to the bit line amplitude voltage VDL of the select state from the column decoder to come to an activated state according to the address that has been input at the same time. As a result, the data that has been held in the sense amplifier is read to the input/output line LIOt/b. Thereafter, although being not shown, the data is outputted to the external through the main amplifier and the input/output section. Subsequently, the operation when the precharge command PRE is inputted will be described. When the precharge command is inputted, the selected word line transits to the word line waiting level VWL in a state where the selected word line is non-selected. With the above operation, the sense amplifier activated signals NCS and PCS are unselected. After the sense amplifiers have been deactivated, the bit line precharge signals BLEQ_U and BLEG_D are activated, and all of the bit lines and the reference bit lines of the activated memory cell array AARY are set to the bit line precharge level. In this drawing, the bit line precharge level is set to VDL/2 that is ½ of the bit line amplitude voltage. With this operation, the precharging operation is completed.

Figure 12:
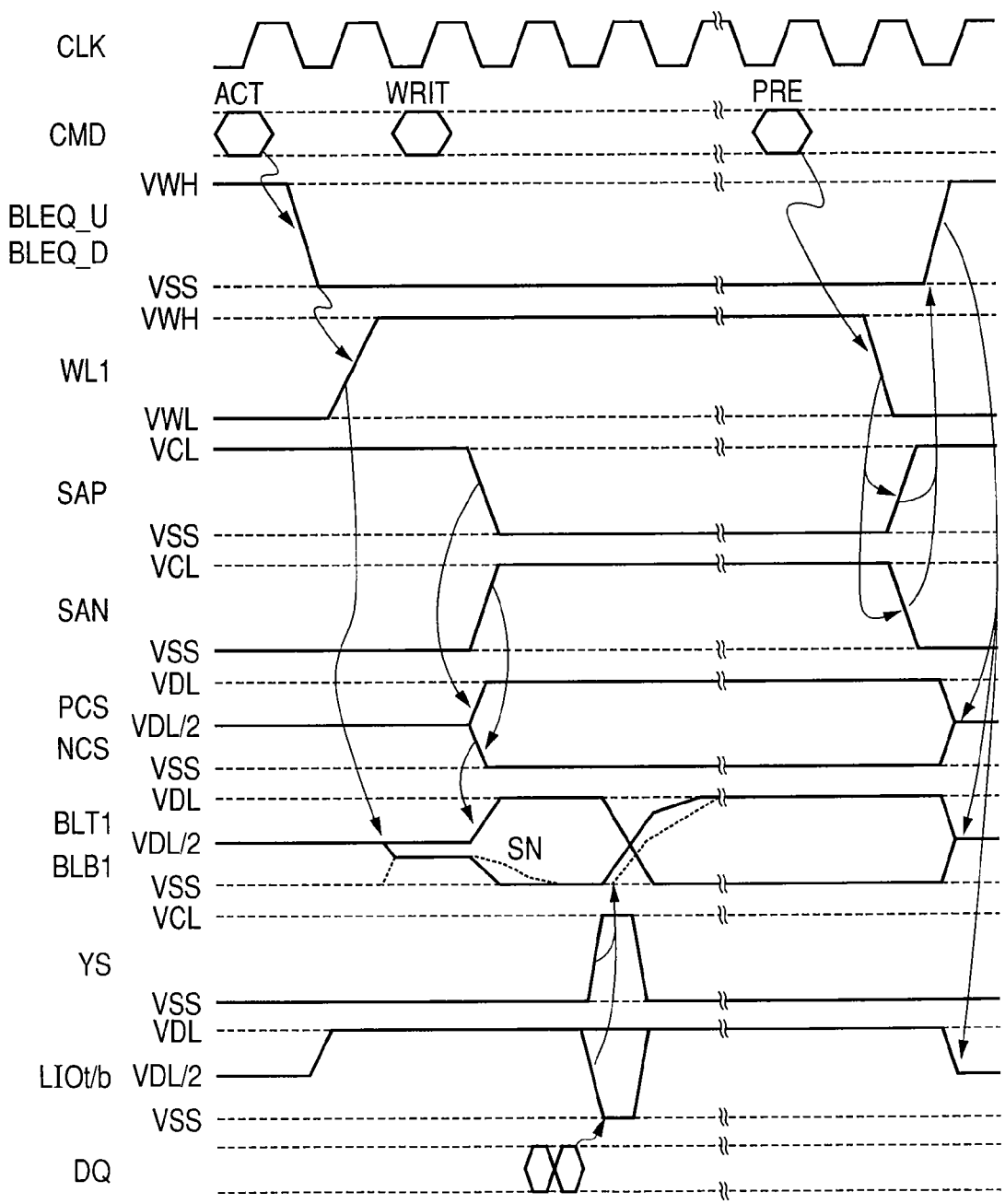
FIG. 12 is a timing chart showing an example of the writing operation waveforms of the synchronous DRAM to which the present invention is applied.

Subsequently, the writing operation will be described with reference to FIG. 12. Upon inputting the active command ACT, the sense amplifier is activated, and the same reading operation as that described above is conducted until the column command is inputted. The writing operation is conducted by inputting a write command WRIT and a write address in a column command input waiting state at the same time. That is, there are a case in which the write command WRIT and the write address are inputted immediately after the active command as shown in FIG. 12, or input after the above-mentioned read command READ. The write data is inputted together with the command and the address, or at the leading or trailing edge of a clock after one clock cycle time. The write data is inputted from an input/output pin DQ, and then transferred to an internal input/output line LIOt/b. The transferred data is written in the sense amplifier circuit that is connected to the write cell by the aid of a column selected line YS that is selected according to the write address which has been input together with the write command. In the sense amplifier, the bit line is driven according to the data that has been written from the input/output line LIOt/b to write data in the storage node of the memory cell. FIG. 12 shows a waveform diagram in which "H" data is written in the cell where the read data is "L". The internal operation after the precharge command has been input is the same as that described in the above-mentioned reading operation. This operation is described as one of the operation of DDRSDRAM, but the substrate voltage control according to the present invention can be applied to the normal SDRAM or a DDR2-SDRAM.

Figure 13:
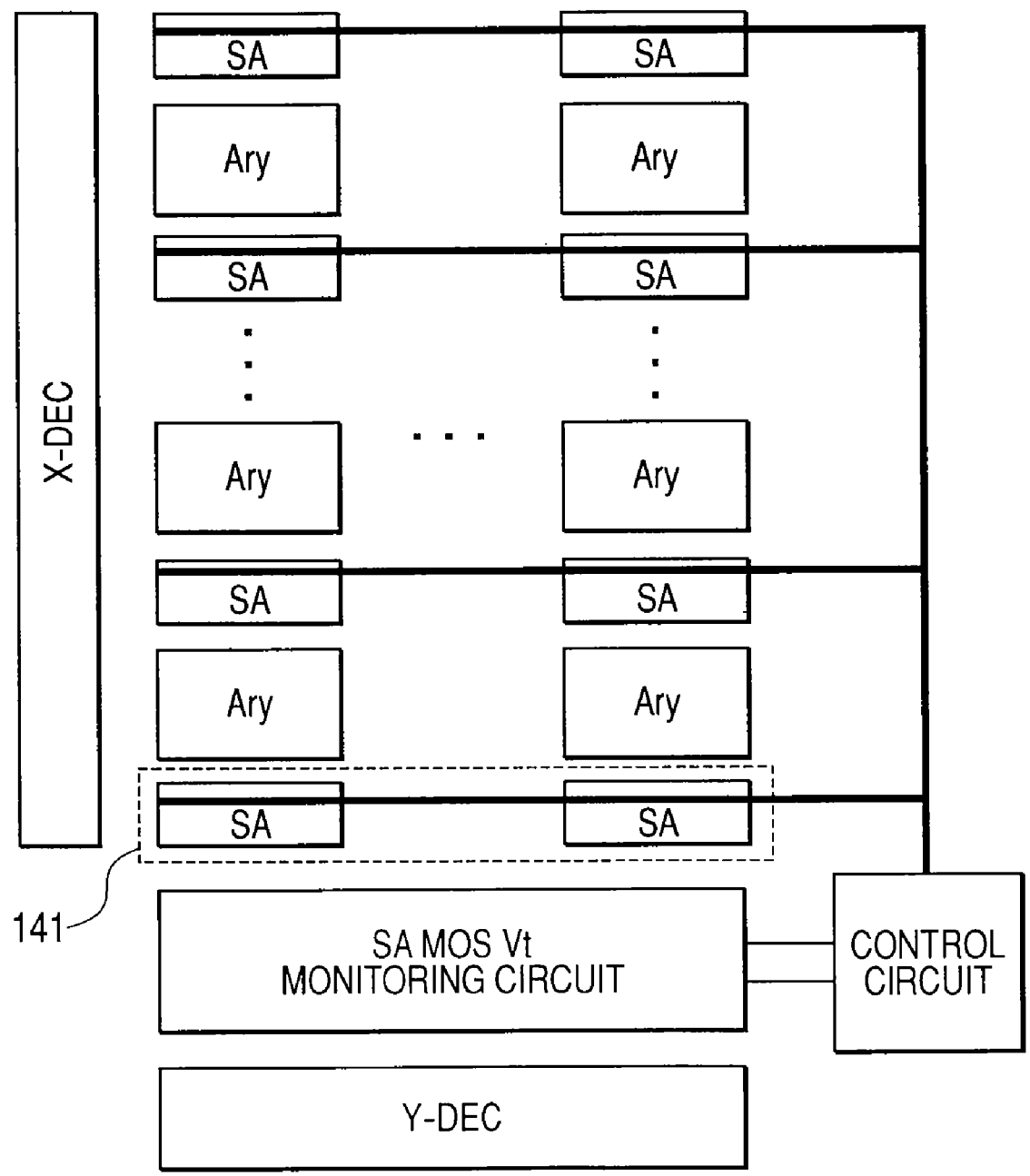
FIG. 13 is a diagram showing a layout example of a sense amplifier MOS transistor monitoring circuit and a control circuit according to a first embodiment of the present invention.

FIG. 13 shows a block diagram when the layout of the sense amplifier MOS transistor threshold voltage monitoring circuit shown in FIG. 10 is actually arranged with respect to the layout of the sense amplifier shown in FIG. 9. The control unit shown in the block diagram is made adaptive to the half bank and one bank. The sense amplifier MOS transistor threshold voltage monitoring circuit is arranged in parallel to the sense amplifiers between the Y-decoder (Y-DEC) and the sense amplifier arrays 141 (SA). As described above, the sense amplifier MOS transistor threshold voltage monitoring circuit has the same configuration as that of the sense amplifier MOS transistor. The above arrangement makes it possible to monitor a variation in the threshold voltage of the sense amplifier MOS transistor of the sense amplifier arrays 141 with high precision, and to control the substrate voltage so as not to suffer from a problem on the variation in the threshold voltage of the sense amplifiers on both sides of the sense amplifier arrays 141.

Figure 17:
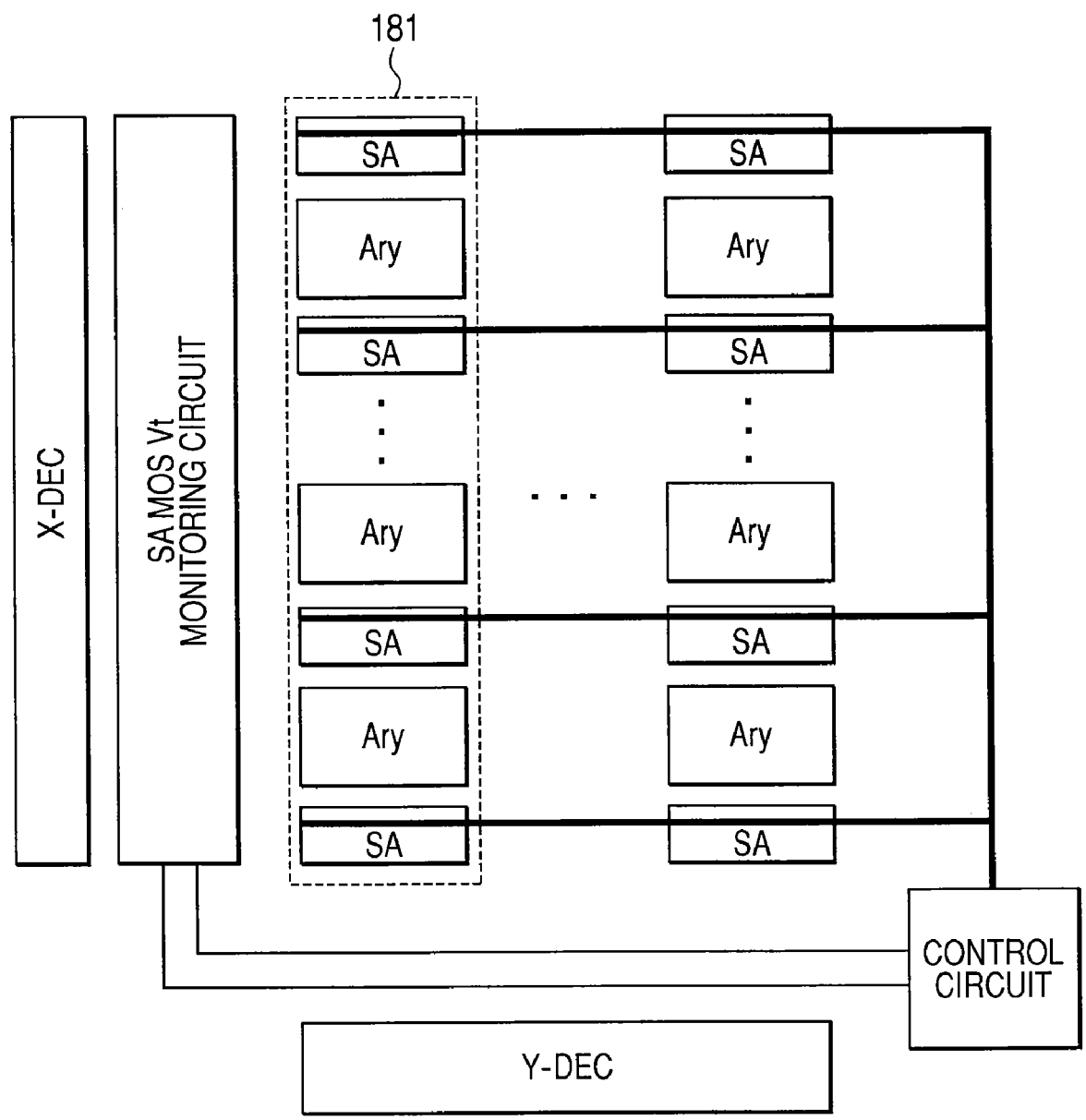
FIG. 17 is a diagram showing another layout example of the entire DRAM chip.

FIG. 17 shows a block diagram of a semiconductor device according to another embodiment of the present invention. This embodiment changes the layout of the sense amplifier MOS transistor threshold voltage monitoring circuit shown in FIG. 13. A difference in the layout between FIGS. 17 and 13 resides in that the sense amplifier MOS transistor threshold voltage monitoring circuit is arranged between the X-decoder (X-DEC) and array blocks 181 so that the longitudinal positions of the sense amplifiers and the monitoring circuit are equal to each other. As described above, the sense amplifier MOS transistor threshold voltage monitoring circuit has the same configuration as that of the sense amplifier MOS transistor. The above arrangement makes it possible to monitor a variation in the sense amplifier MOS transistor threshold voltage of the sense amplifiers and the array blocks 181 with high precision, and to detect the threshold voltage center value including the variation in the sense amplifier threshold voltage on both of the upper and lower ends and control the substrate voltage.

Figure 18:
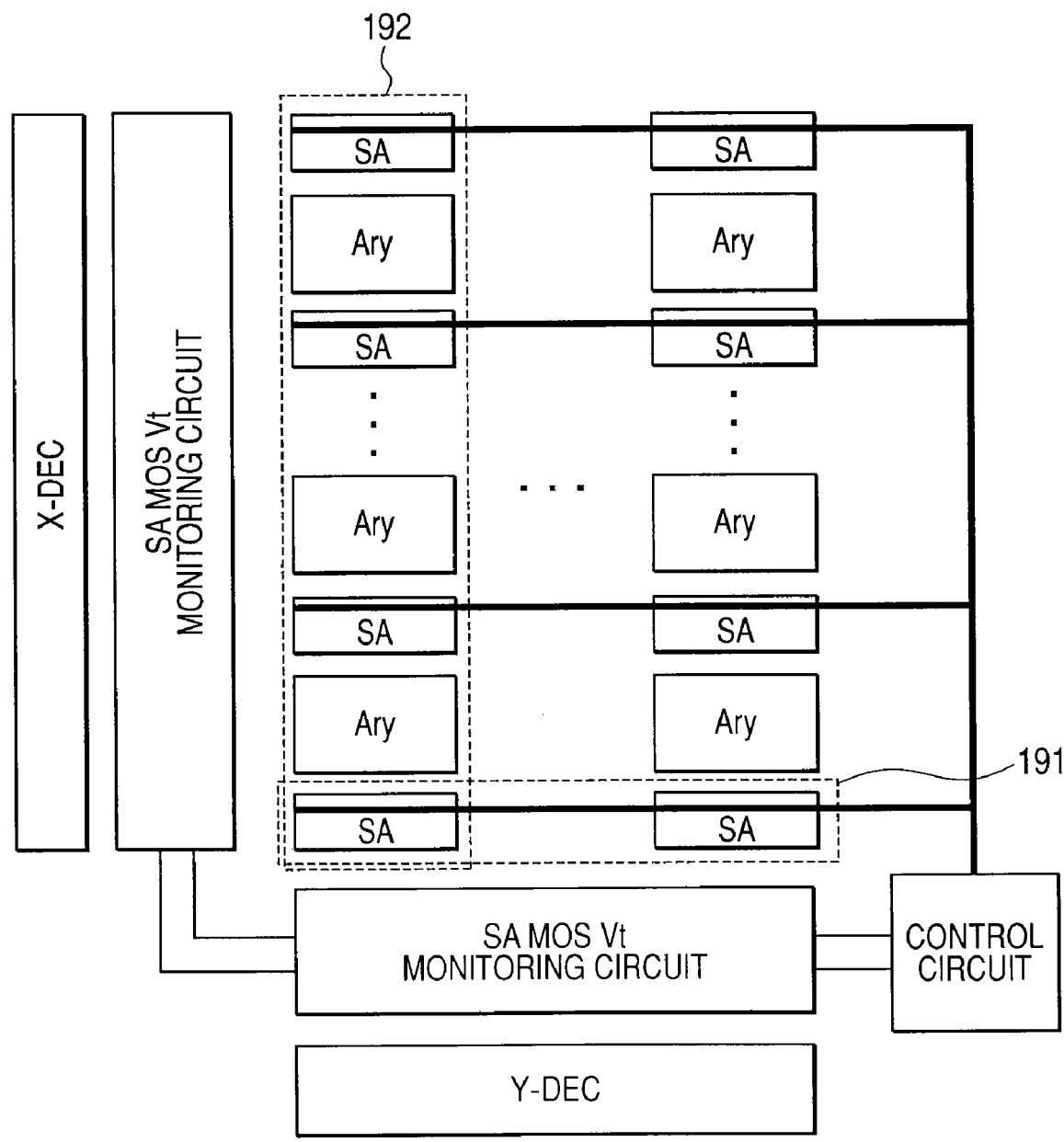
FIG. 18 is a diagram showing still another layout example of the entire DRAM chip.

FIG. 18 is a block diagram showing a semiconductor device according to still another embodiment of the present invention. A difference of FIG. 18 from FIGS. 13 and 17 resides in that two sense amplifier MOS transistor threshold voltage monitoring circuits are arranged. One sense amplifier MOS transistor threshold voltage monitoring circuit is arranged between the Y-decoder (Y-DEC) and the sense amplifier arrays 191 (SA) so as to be in parallel to the sense amplifiers, and another sense amplifier MOS transistor threshold voltage monitoring circuit is arranged between the X-decoder (X-DEC) and the array block 192 so that the longitudinal positions of the sense amplifiers and the monitoring circuit are equal to each other. As described above, the sense amplifier MOS transistor threshold voltage monitoring circuits have the same configuration as that of the sense amplifier MOS transistor. The above arrangement makes it possible to monitor a variation in the threshold voltages of the lateral sense amplifier MOS transistors of the sense amplifier arrays 191 and a variation in the threshold voltages of the longitudinal sense amplifier MOS transistors within the sense amplifier and array blocks 192 with high precision. With the above configuration, not only a variation in the threshold voltage of the MOS transistors in one direction of the lateral direction or the longitudinal direction, but also a variation in the threshold voltage of the MOS transistors that are physically farthest from each other can be monitored. Also, it is possible to detect the center value of the threshold voltages including the threshold voltage variations of the sense amplifiers that are physically disposed at the farthest ends from each other, and control the substrate voltage.

Figure 19:
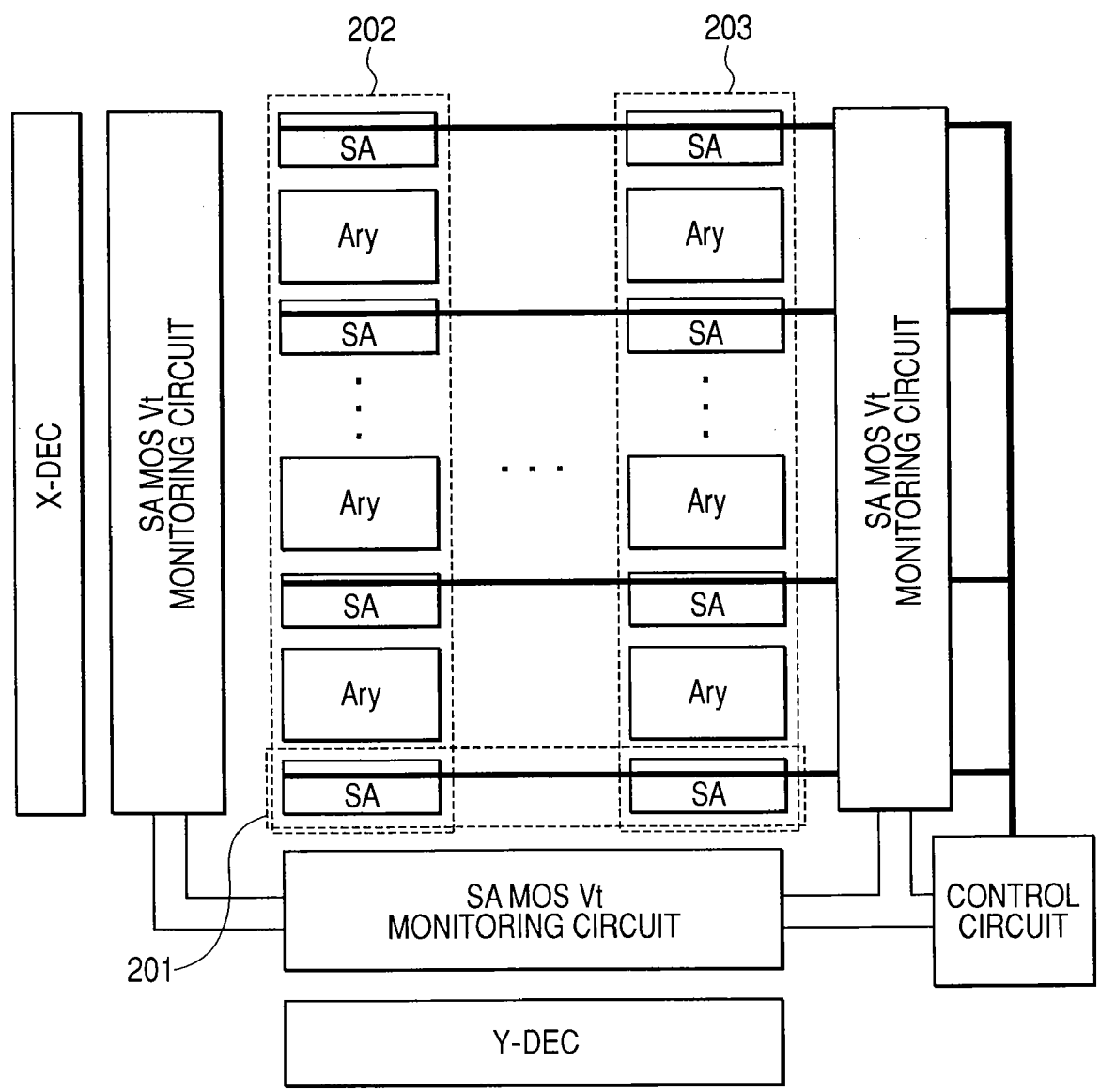
FIG. 19 is a diagram showing yet still another layout example of the entire DRAM chip.

FIG. 19 shows a block diagram of a semiconductor device according to yet still another embodiment of the present invention. A difference from FIG. 18 resides in that three sense amplifier MOS transistor threshold voltage monitoring circuits are disposed. A first sense amplifier MOS transistor threshold voltage monitoring circuit is disposed between the Y-decoder (Y-DEC) and the sense amplifier arrays 201 (SA) so as to be in parallel to the sense amplifiers. A second sense amplifier MOS transistor threshold voltage monitoring circuit is disposed between the X-decoder (X-DEC) and an array block 202, and a third sense amplifier MOS transistor threshold voltage monitoring circuit is disposed at a right side of an array block 203, in such a manner that the longitudinal positions of the sense amplifiers and the monitoring circuits are equal to each other, respectively. As described above, the sense amplifier MOS transistor threshold voltage monitoring circuits have the same configuration as that of the sense amplifier MOS transistor. The above arrangement makes it possible to monitor a variation in the threshold voltages of the lateral sense amplifier MOS transistors of the sense amplifier arrays 201 and a variation in the threshold voltages of the longitudinal sense amplifier MOS transistors within the sense amplifier and arrayblocks 202 and 203 with high precision. With the above configuration, not only a variation in the threshold voltage of the MOS transistors in one direction of the lateral direction or the longitudinal direction, but also a variation in the threshold voltage of the MOS transistors that are physically farthest from each other as well as a variation in the threshold voltage which is different between both of right and left ends of the MOS transistors in the same longitudinal direction can be monitored. It is possible to detect the center value of the threshold voltages including a variation in the threshold voltage in the lateral direction in the vicinity of the Y-DEC and a variation in the threshold voltage which is different between both of right and left ends in the same longitudinal direction, and control the substrate voltage.

Figure 20:
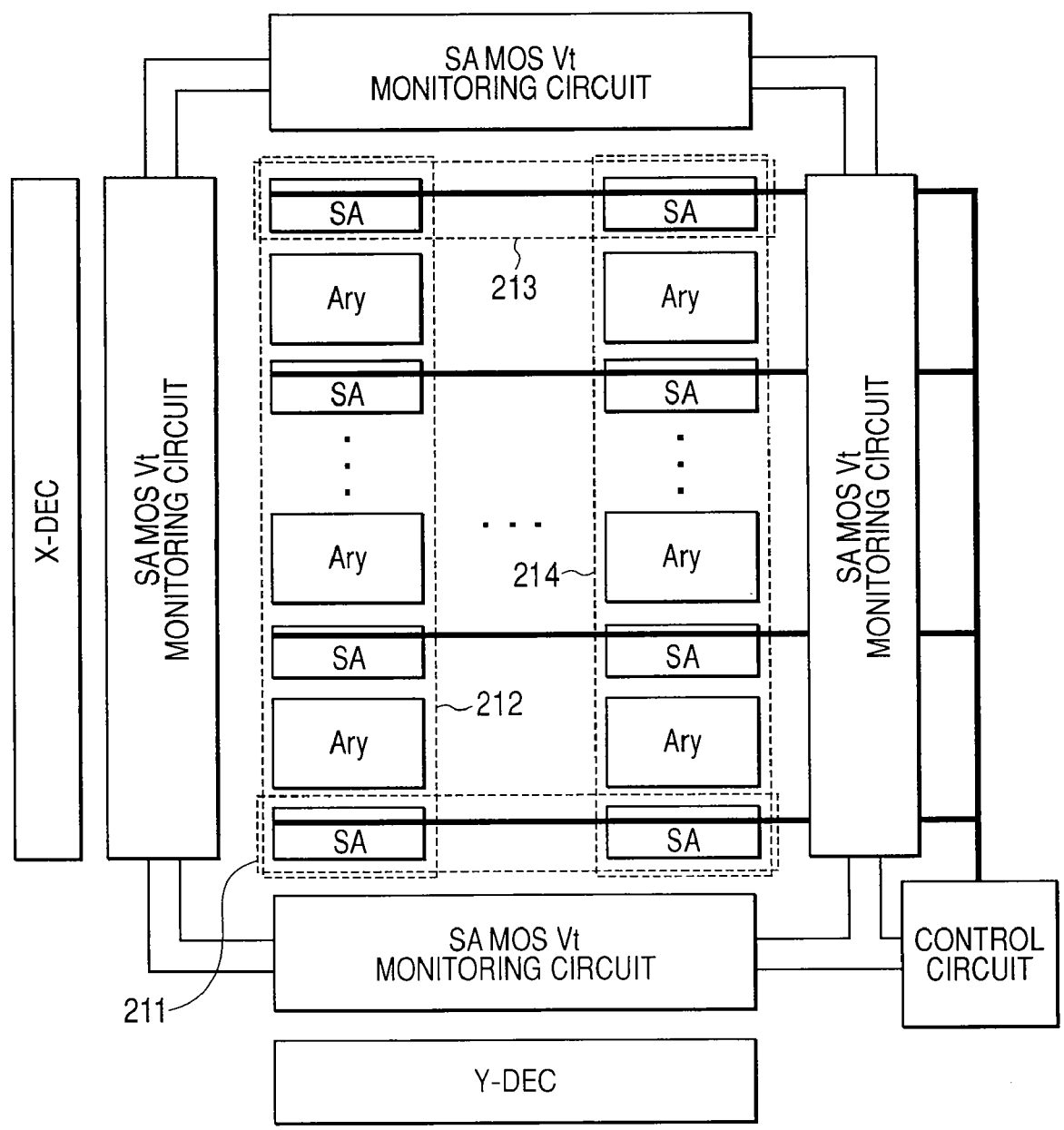
FIG. 20 is a diagram showing yet still another layout example of the entire DRAM chip.

FIG. 20 shows a block diagram of a semiconductor device according to yet still another embodiment of the present invention. A difference from FIG. 19 resides in that four sense amplifier MOS transistor threshold voltage monitoring circuits are disposed. A first sense amplifier MOS transistor threshold voltage monitoring circuit is disposed between the Y-decoder (Y-DEC) and sense amplifier arrays 211 (SA) so as to be in parallel to the sense amplifiers. A second sense amplifier MOS transistor threshold voltage monitoring circuit is disposed at an upper side of sense amplifier arrays 213 (SA) so as to be in parallel to the sense amplifiers. A third sense amplifier MOS transistor threshold voltage monitoring circuit is disposed between the X-decoder (X-DEC) and an array block 212, and a fourth sense amplifier MOS transistor threshold voltage monitoring circuit is disposed at a right side of an array block 213 in such a manner that the longitudinal positions of the sense amplifiers and the monitoring circuits are equal to each other, respectively. As described above, the sense amplifier MOS transistor threshold voltage monitoring circuits have the same configuration as that of the sense amplifier MOS transistor. The above arrangement makes it possible to monitor a variation in the threshold voltages of the lateral sense amplifier MOS transistors of the sense amplifier arrays 211 and 213, and a variation in the threshold voltages of the longitudinal sense amplifier MOS transistors within the sense amplifier and array blocks 202 and 203 with high precision. With the above configuration, not only a variation in the threshold voltage of the MOS transistors in one direction of the lateral direction or the longitudinal direction, but also a variation in the threshold voltage which is different between both of upper and lower ends of the MOS transistors even in the same lateral direction, as well as a variation in the threshold voltage which is different between both of right and left ends of the MOS transistors even in the same longitudinal direction can be monitored. From the above monitoring results, it is possible to detect the center value of the threshold voltages including a variation in the threshold voltage which is different between both of upper and lower ends even in the lateral direction and a variation in the threshold voltage which is different between both of right and left ends even in the same longitudinal direction, and control the substrate voltage.

Figure 21:
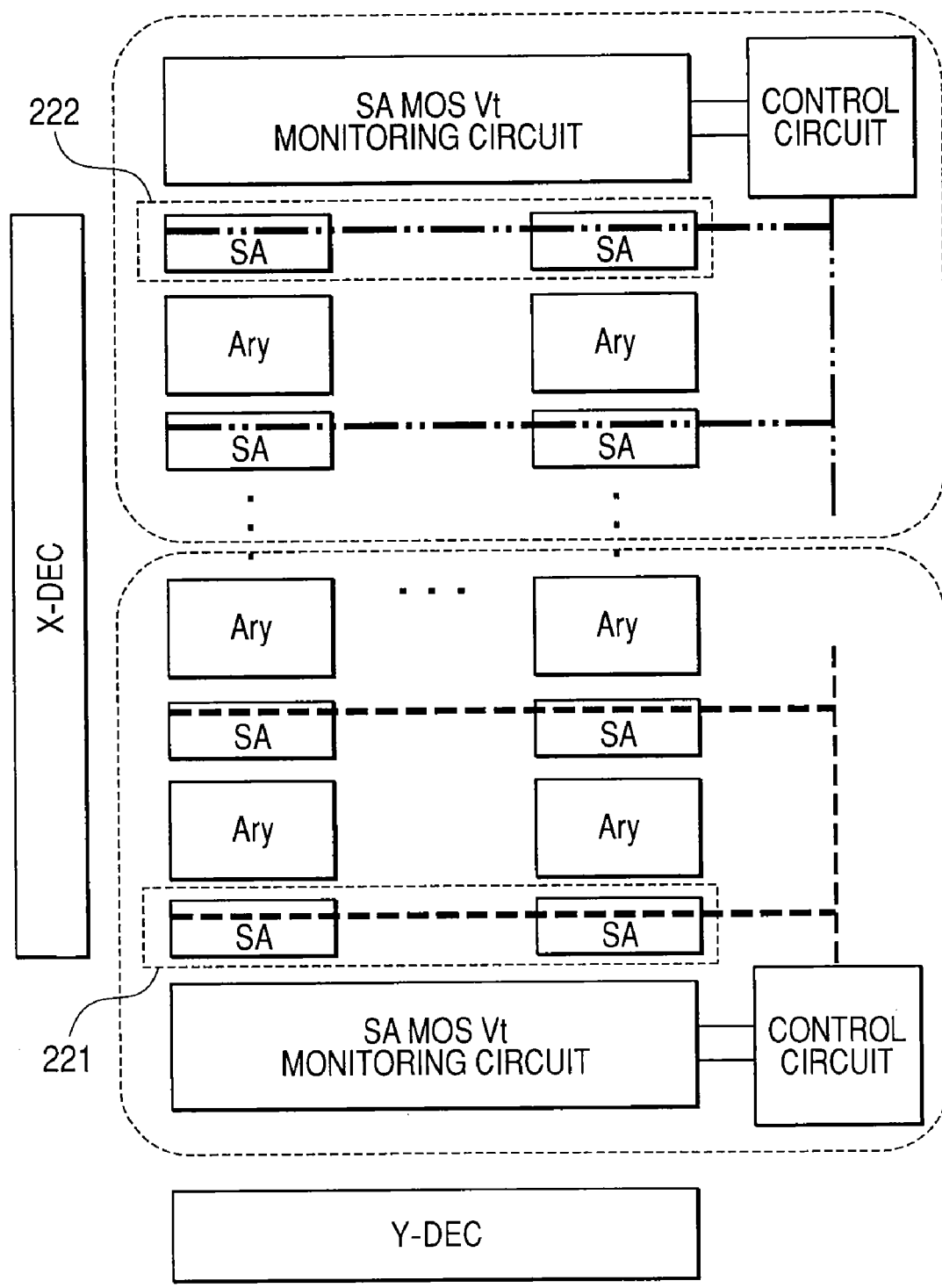
FIG. 21 is a diagram showing yet still another layout example of the entire DRAM chip.

FIG. 21 shows a block diagram of a semiconductor device according to yet still another embodiment of the present invention. A difference from FIG. 13 resides in that the array block is divided into two parts from the center, and the sense amplifier MOS transistor threshold voltage monitoring circuits and the control circuits are disposed in the upper and lower portions, independently. One sense amplifier MOS transistor threshold voltage monitoring circuit is disposed between the Y-decoder (Y-DEC) and a sense amplifier array 221 (SA) so as to be in parallel to the sense amplifiers, and another sense amplifier MOS transistor threshold voltage monitoring circuit is disposed at an upper side of a sense amplifier array 222 (SA) so as to be in parallel to the sense amplifiers. As described above, the sense amplifier MOS transistor threshold voltage monitoring circuits have the same configuration as that of the sense amplifier MOS transistor. Since the sense amplifier MOS transistor threshold voltage monitoring circuits and the control circuits are provided in the upper half and the lower half, separately, it is possible to more finely detect the center value of the threshold voltages including a variation in the threshold voltages of the lateral sense amplifier MOS transistors, and to more finely control the substrate voltage as compared with a case in which only one control circuit is provided.

Figure 22:
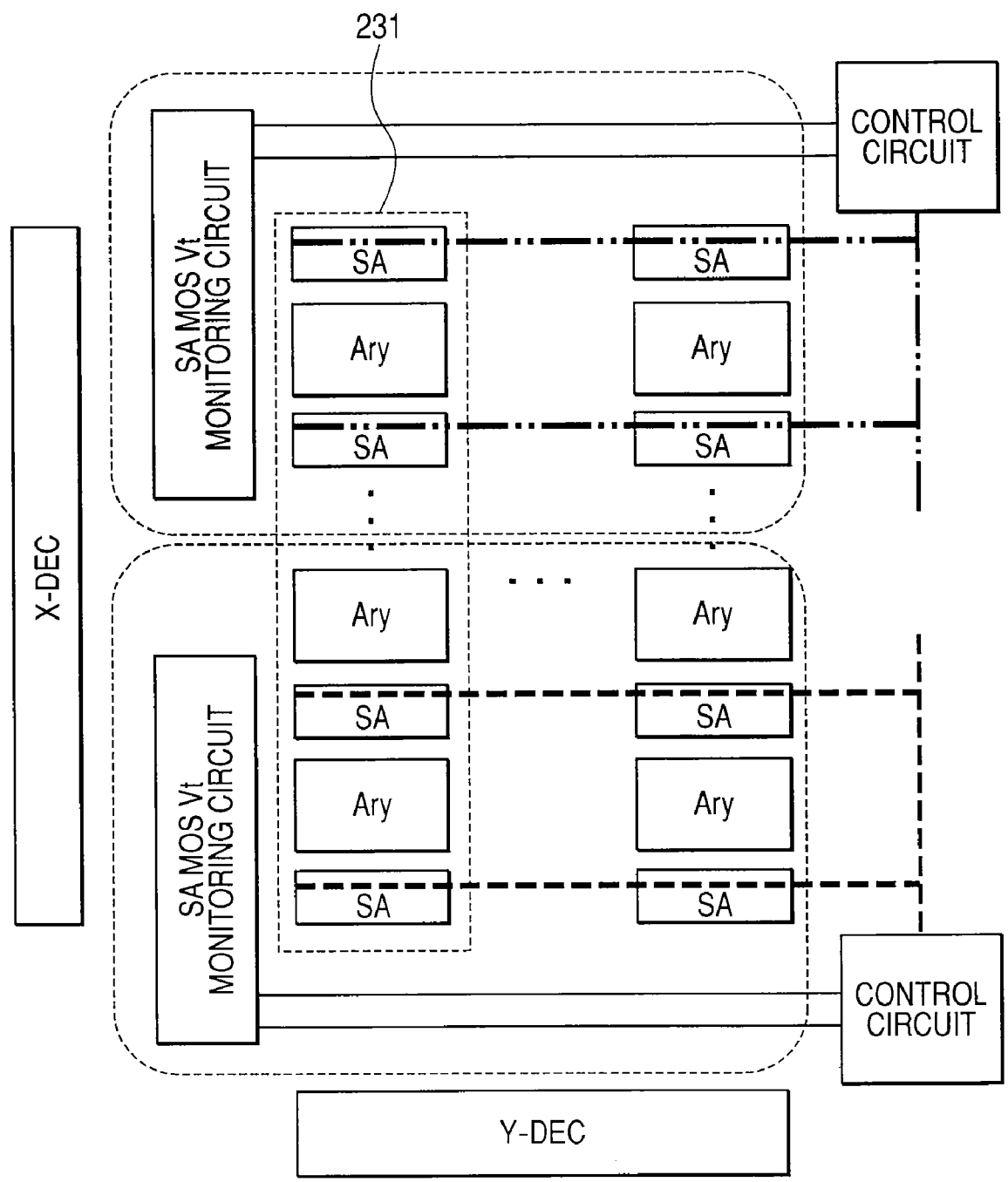
FIG. 22 is a diagram showing yet still another layout example of the entire DRAM chip.

FIG. 22 shows a block diagram of a semiconductor device according to yet still another embodiment of the present invention. A difference from FIG. 21 resides in that the layout of the sense amplifier MOS transistor threshold voltage monitoring circuits is changed. The upper monitoring circuit and the lower monitoring circuit are disposed in parallel to the X-DEC in such a manner that the longitudinal positions of the sense amplifier MOS transistors of an array block 231 and the MOS transistors of the monitoring circuit are equal to each other. As described above, the sense amplifier MOS transistor threshold voltage monitoring circuits have the same configuration as that of the sense amplifier MOS transistor. Since the sense amplifier MOS transistor threshold voltage monitoring circuits and the control circuits are provided in the upper half and the lower half, separately, it is possible to more finely detect the center value of the threshold voltages including a variation in the threshold voltages of the longitudinal sense amplifier MOS transistors, and to more finely control the substrate voltage as compared with a case in which only one control circuit is provided.

Figure 23:
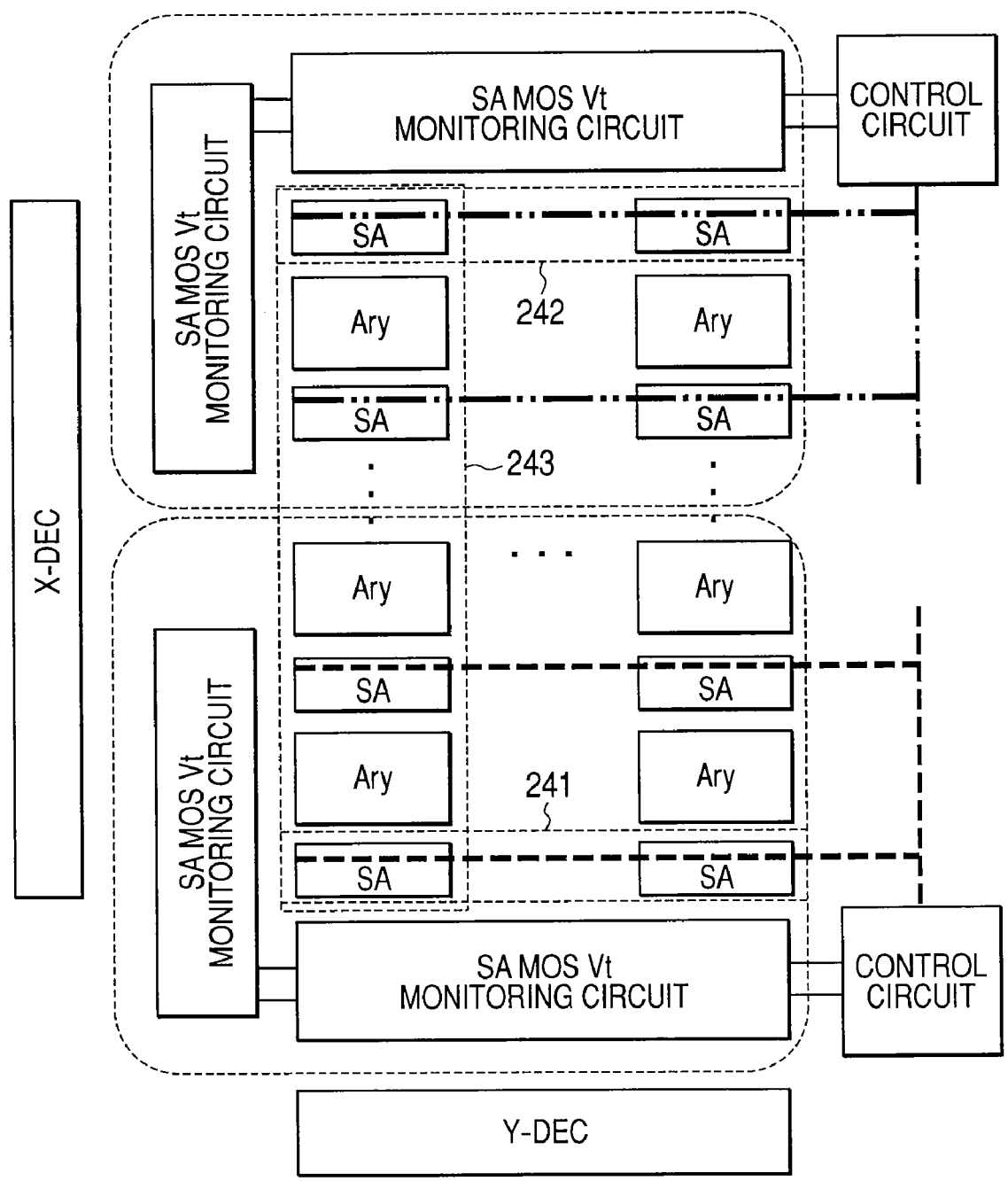
FIG. 23 is a diagram showing yet still another layout example of the entire DRAM chip.

FIG. 23 shows a block diagram of a semiconductor device according to yet still another embodiment of the present invention. A difference between FIGS. 21 and 22 resides in that the layout of the sense amplifier MOS transistor threshold voltage monitoring circuits is changed. One sense amplifier MOS transistor threshold voltage monitoring circuit is disposed between the Y-DEC and a sense amplifier array 241 so as to be in parallel to the sense amplifiers, and another sense amplifier MOS transistor threshold voltage monitoring circuit is disposed at an upper side of a sense amplifier array 242 so as to be in parallel to the sense amplifiers. In the longitudinal direction, an upper monitoring circuit and a lower monitoring circuit are arranged in parallel to the X-DEC in such a manner that the longitudinal positions of the sense amplifier MOS transistor of the array block 243 and the MOS transistor of the monitoring circuit are equal to each other. As described above, the sense amplifier MOS transistor threshold voltage monitoring circuits have the same configuration as that of the sense amplifier MOS transistor. Since the sense amplifier MOS transistor threshold voltage monitoring circuits and the control circuits are provided in the upper half and the lower half, separately, it is possible to more finely detect the center value of the threshold voltages including a variation in the threshold voltages of the lateral sense amplifier MOS transistors and a variation in the threshold voltages of the longitudinal sense amplifier MOS transistors, and to more finely control the substrate voltage as compared with a case in which only one control circuit is provided.

Figure 24:
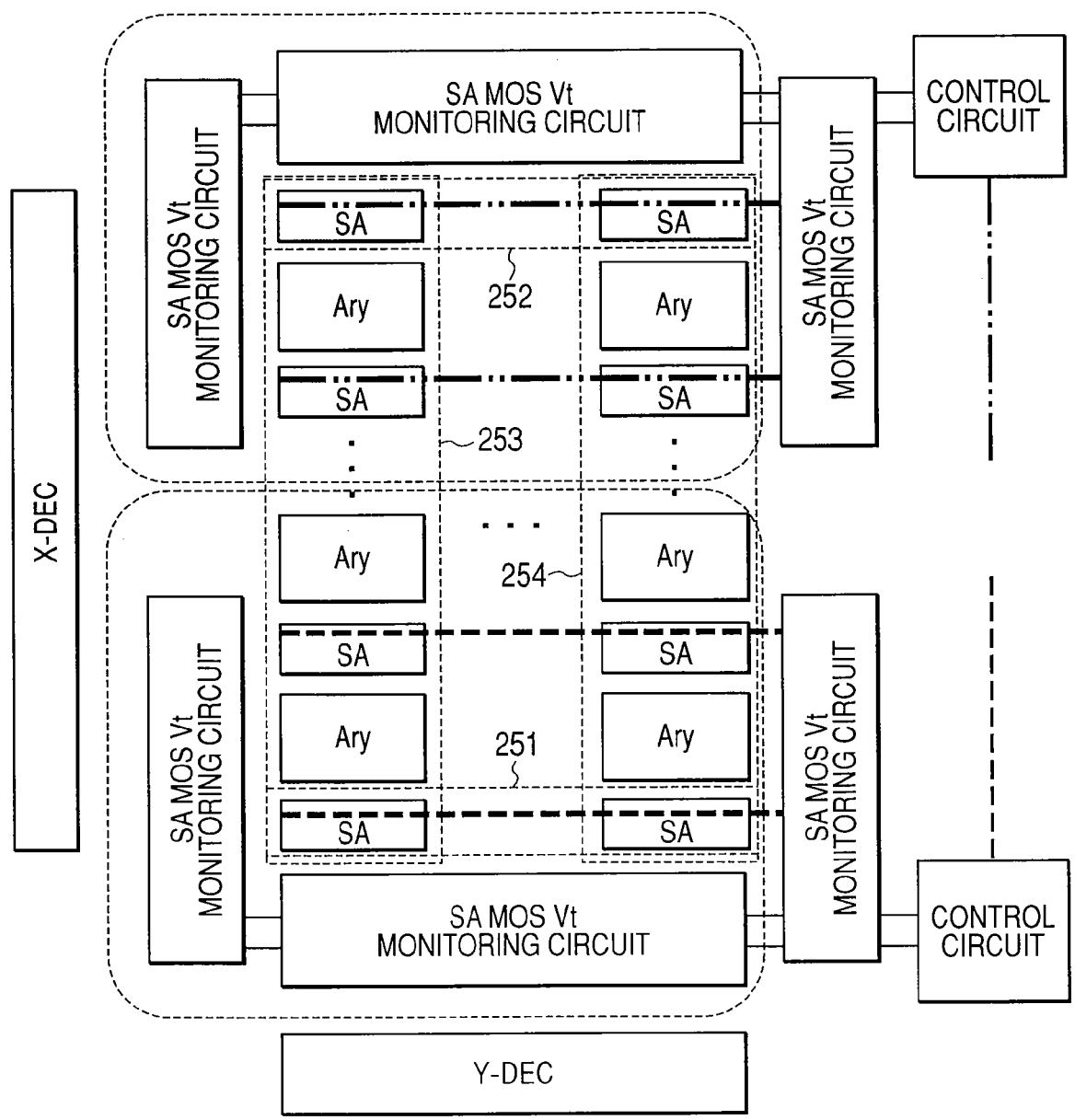
FIG. 24 is a diagram showing yet still another layout example of the entire DRAM chip.

FIG. 24 shows a block diagram of a semiconductor device according to yet still another embodiment of the present invention. A difference from FIG. 23 resides in that the layout of the sense amplifier MOS transistor threshold voltage monitoring circuits is changed. One sense amplifier MOS transistor threshold voltage monitoring circuit is disposed between the Y-DEC and a sense amplifier array 251 so as to be in parallel to the sense amplifiers, and another sense amplifier MOS transistor threshold voltage monitoring circuit is disposed at an upper side of a sense amplifier array 252 so as to be in parallel to the sense amplifiers. In the longitudinal direction, an upper monitoring circuit and a lower monitoring circuit are arranged at both of the right and left sides in parallel to the X-DEC in such a manner that the longitudinal positions of the sense amplifier MOS transistors of the array blocks 253 and 254 and the MOS transistors of the monitoring circuit are equal to each other. As described above, the sense amplifier MOS transistor threshold voltage monitoring circuits have the same configuration as that of the sense amplifier MOS transistor. Since the sense amplifier MOS transistor threshold voltage monitoring circuits and the control circuits are provided in the upper half and the lower half, separately, it is possible to more finely detect the center value of the threshold voltages including a variation in the threshold voltage of the lateral sense amplifier MOS transistors and a variation in the threshold voltage of the longitudinal sense amplifier MOS transistors, and to more finely control the substrate voltage as compared with a case in which only one control circuit is provided.

Figure 25:
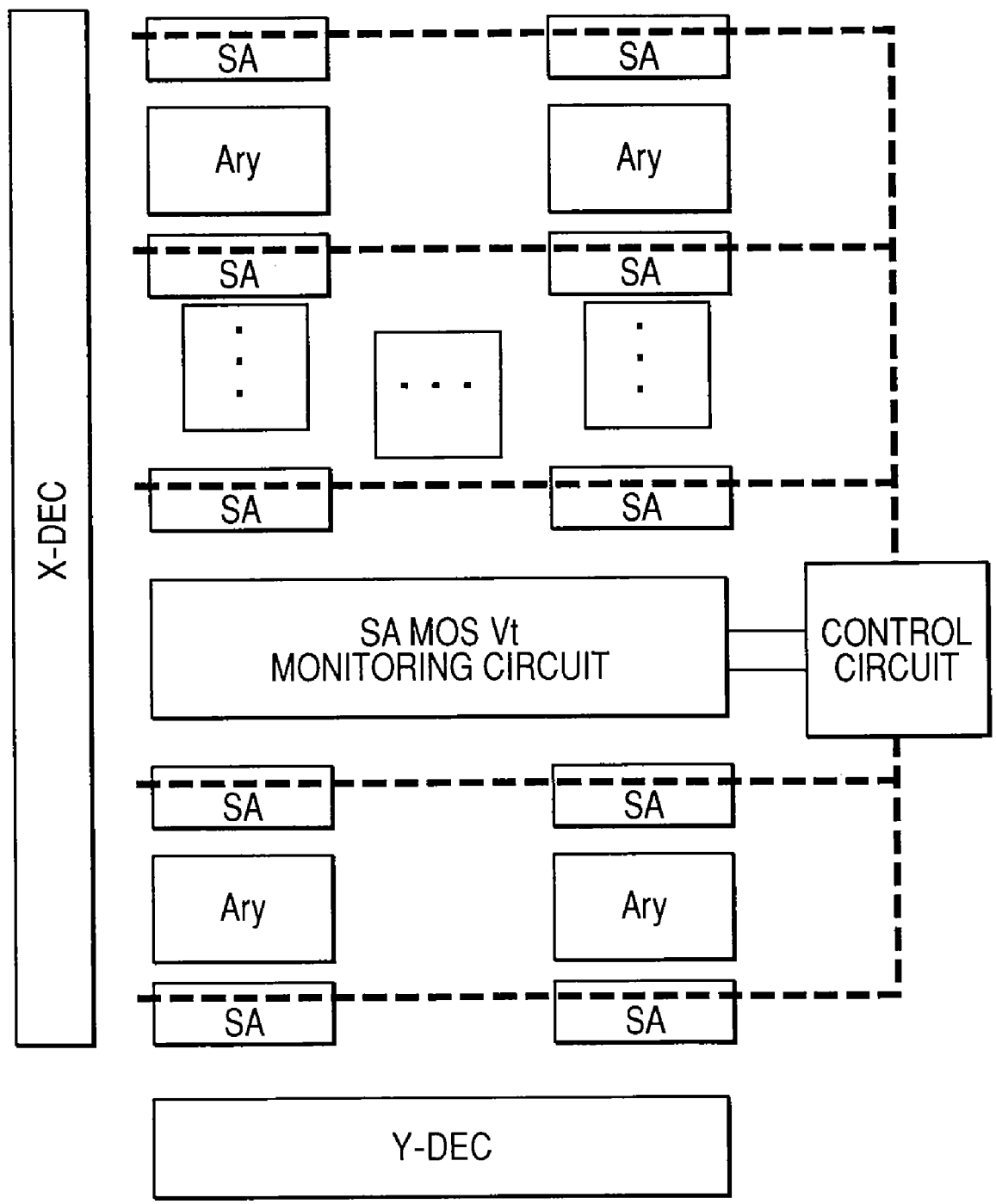
FIG. 25 is a diagram showing yet still another layout example of the entire DRAM chip.

FIG. 25 shows a block diagram of a semiconductor device according to yet still another embodiment of the present invention. A difference from FIG. 13 resides in that the layout of the sense amplifier MOS transistor threshold voltage monitoring circuits is changed. A sense amplifier MOS transistor threshold voltage monitoring circuit is disposed in the center of a block in parallel to the Y-DEC. As described above, the sense amplifier MOS transistor threshold voltage monitoring circuit has the same configuration as that of the sense amplifier MOS transistor. Since the sense amplifier MOS transistor threshold voltage monitoring circuit is disposed in the center of the block, it is possible to monitor the more actual threshold voltage of the sense amplifier MOS transistor with high precision as compared with a case in which the sense amplifier MOS transistor threshold voltage monitoring circuit is disposed out of the block as shown in FIG. 24 and other above-mentioned figures. As a result, it is possible to enhance a precision in the detection of the center value of the threshold voltages, and control the substrate voltage on the basis of the center value of the threshold voltages.

Figure 26:
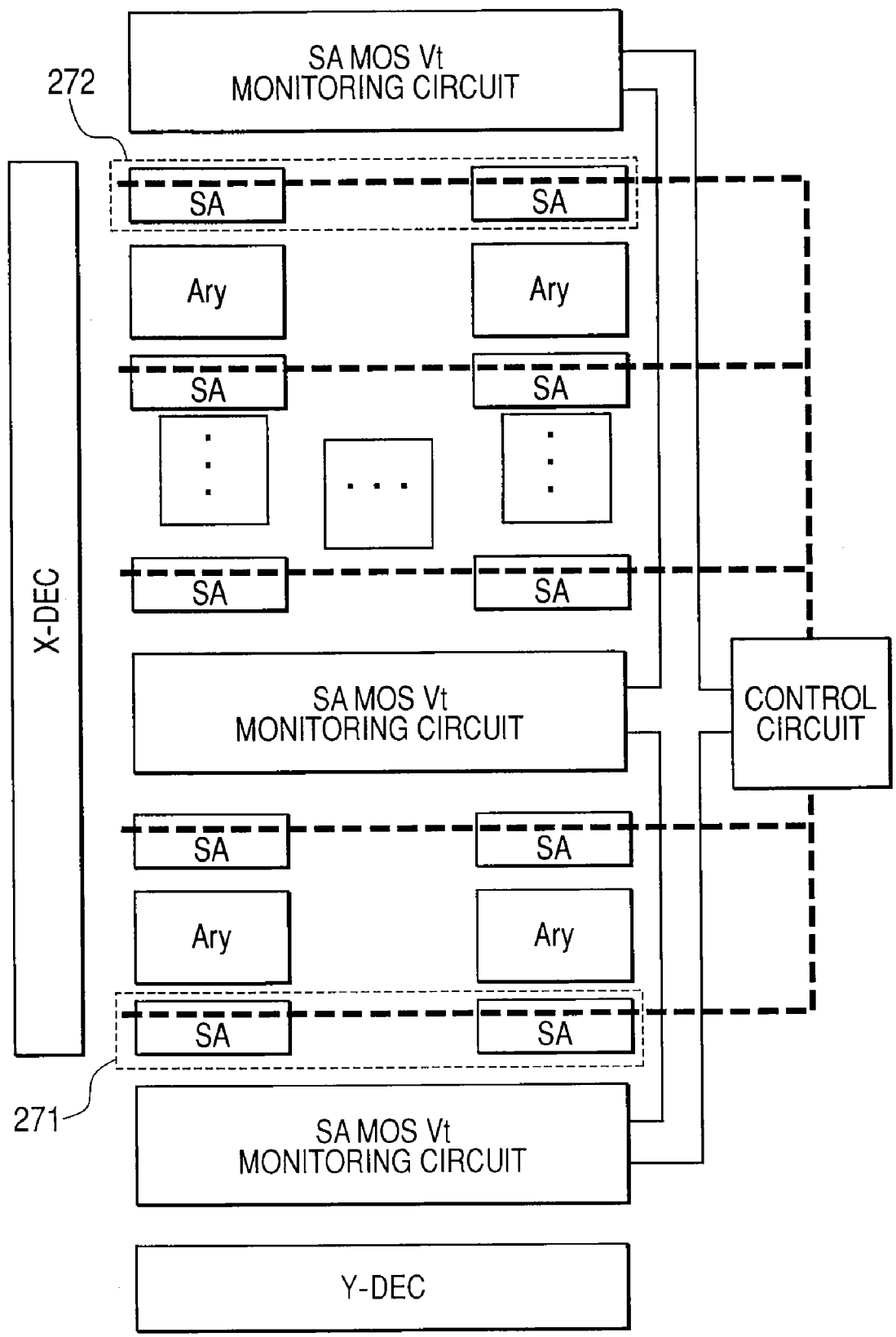
FIG. 26 is a diagram showing yet still another layout example of the entire DRAM chip.

FIG. 26 shows a block diagram of a semiconductor device according to yet still another embodiment of the present invention. A difference from FIG. 25 resides in that the layout of the sense amplifier MOS transistor threshold voltage monitoring circuits is changed. The sense amplifier MOS transistor threshold voltage monitoring circuits are disposed in parallel to the Y-DEC, so as to be in the center of the block, between the Y-DEC and a sense amplifier array 271, and at an upper side of the sense amplifier array 272, respectively. As described above, the sense amplifier MOS transistor threshold voltage monitoring circuits have the same configuration as that of the sense amplifier MOS transistor. The sense amplifier MOS transistor threshold voltage monitoring circuits are disposed in the center of the block; at the upper side, and at the lower side, respectively, so as to increase the number of monitors, thereby making it possible to enhance a precision in the detection of the center value of the threshold voltage, and to control the substrate voltage on the basis of the center value of the threshold voltages.

Figure 27:
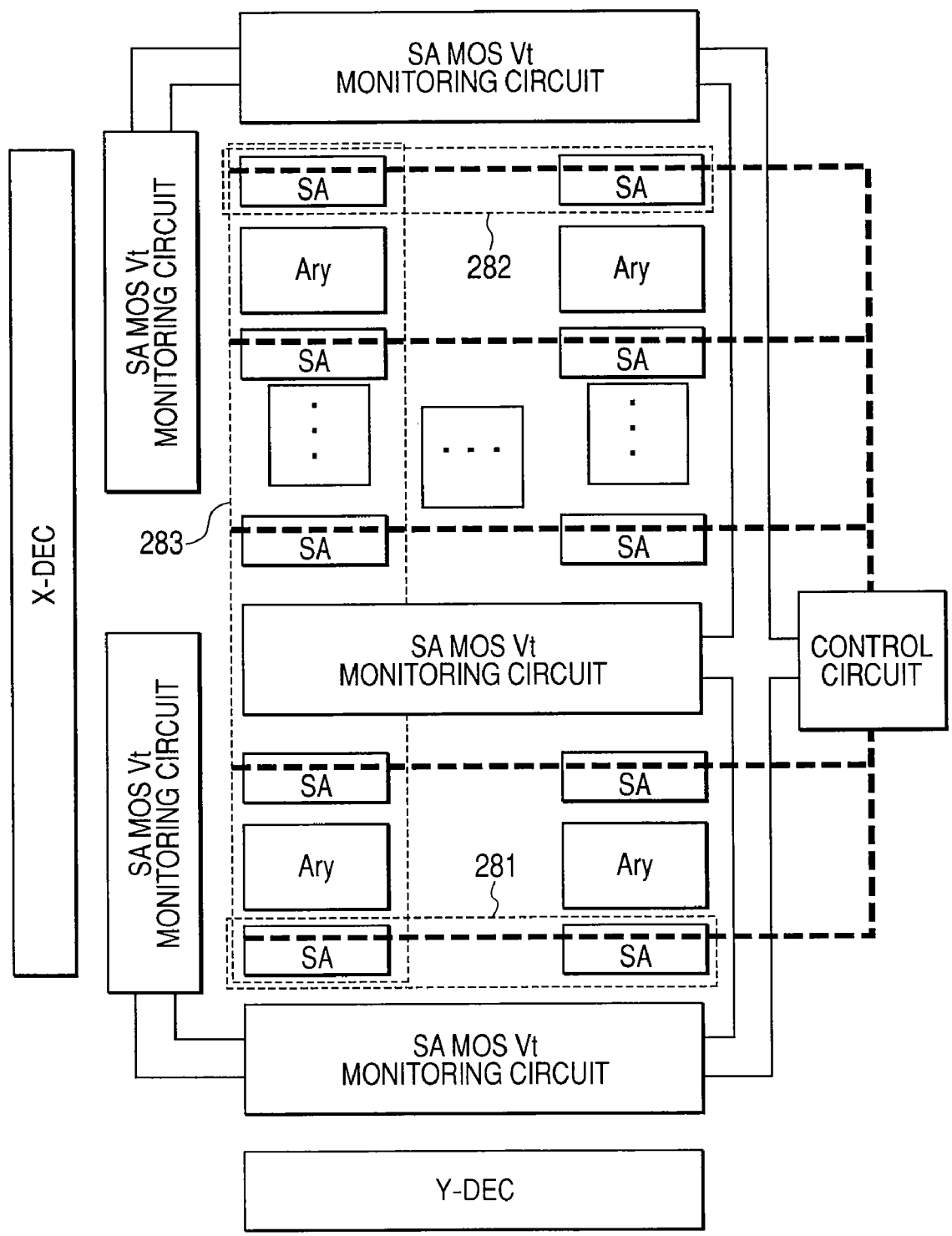
FIG. 27 is a diagram showing yet still another layout example of the entire DRAM chip.

FIG. 27 shows a block diagram of a semiconductor device according to yet still another embodiment of the present invention. A difference from FIG. 26 resides in that the layout of the sense amplifier MOS transistor threshold voltage monitoring circuits is changed. The sense amplifier MOS transistor threshold voltage monitoring circuits are disposed in parallel to the Y-DEC, so as to be in the center of the block, between the Y-DEC and the sense amplifier array 271, and at an upper side of the sense amplifier array 272, respectively. Also, the sense amplifier MOS transistor threshold voltage monitoring circuits are disposed between the X-DEC and an array block 283. As described above, the sense amplifier MOS transistor threshold voltage monitoring circuits have the same configuration as that of the sense amplifier MOS transistor. The sense amplifier MOS transistor threshold voltage monitoring circuits are disposed in the center of the block, at the upper side, at the lower side, and at the side, respectively, so as to increase the number of monitors, thereby making it possible to enhance a precision in the detection of the center value of the threshold voltage as compared with FIG. 26, and to control the substrate voltage on the basis of the center value of the threshold voltages.

Second Embodiment

Figure 14:
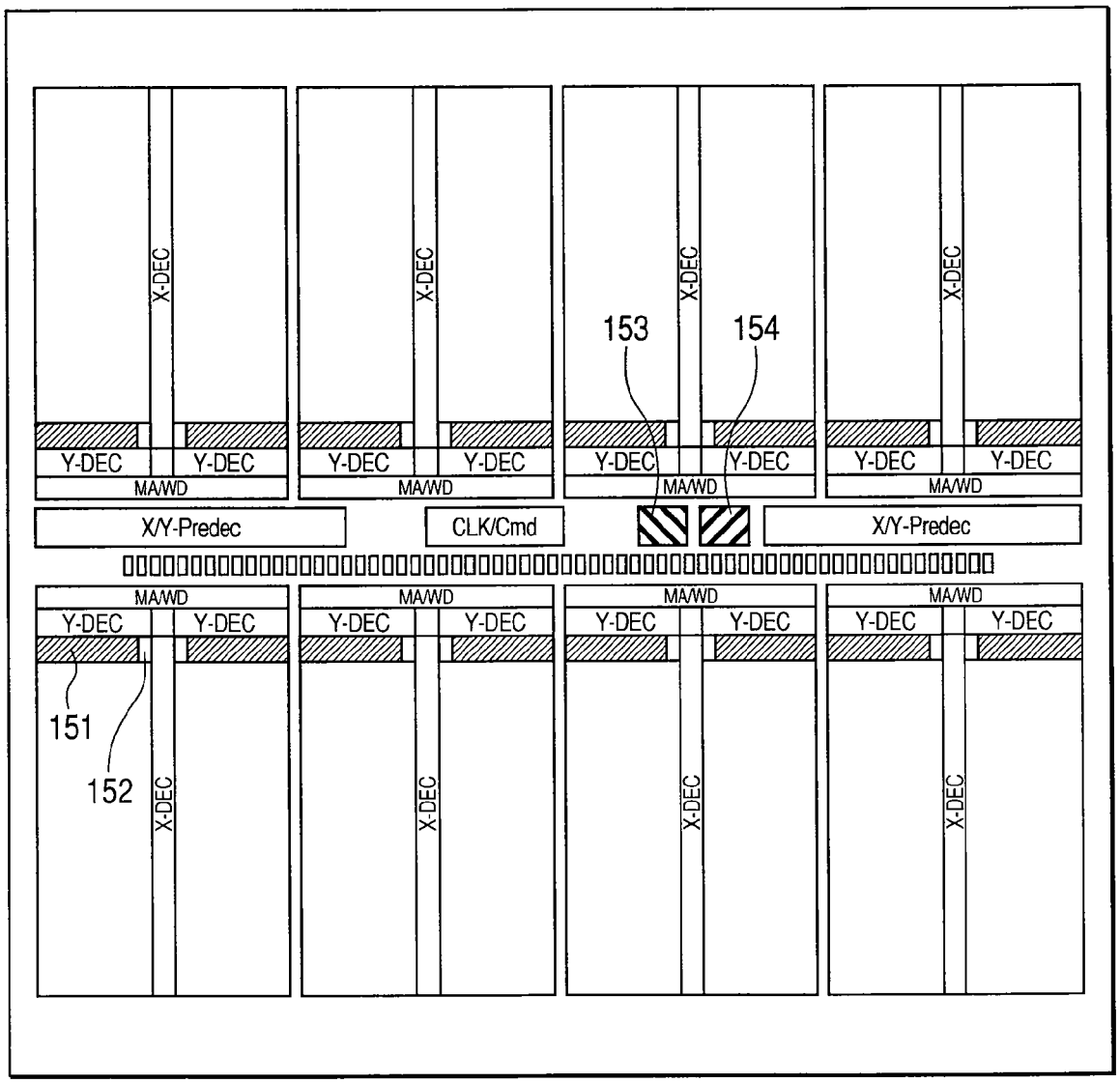
FIG. 14 is a diagram showing a layout example of the entire DRAM chip.

FIG. 14 is a diagram showing the entire block of a semiconductor device according to another embodiment of the present invention. A difference from the first embodiment resides in that variation control circuits 153 and 154 are added. The variation control circuits detect variations in the threshold voltages of the sense amplifier NMOS/PMOS transistors within the chip according to the outputs from the entire NMOS (PMOS) substrate control blocks (sense amplifier NMOS/PMOS transistor threshold voltage monitoring circuits 151 and the control circuits 152) shown in FIGS. 1 and 2, which are disposed in plurality within the DRAM chip, and control the substrate voltage of the entire chip to control the threshold voltages. As a result, it is possible to adjust the sense speed at an optimum speed, and it is possible to reduce the power consumption. The sense amplifier NMOS/PMOS transistor threshold voltage monitoring circuit 151 shown in FIG. 14 which will be described later is substantially identical with that shown in FIGS. 1 and 2. Also, the control circuit 152 are substantially identical with that shown in FIGS. 1 and 2.

Figure 15:
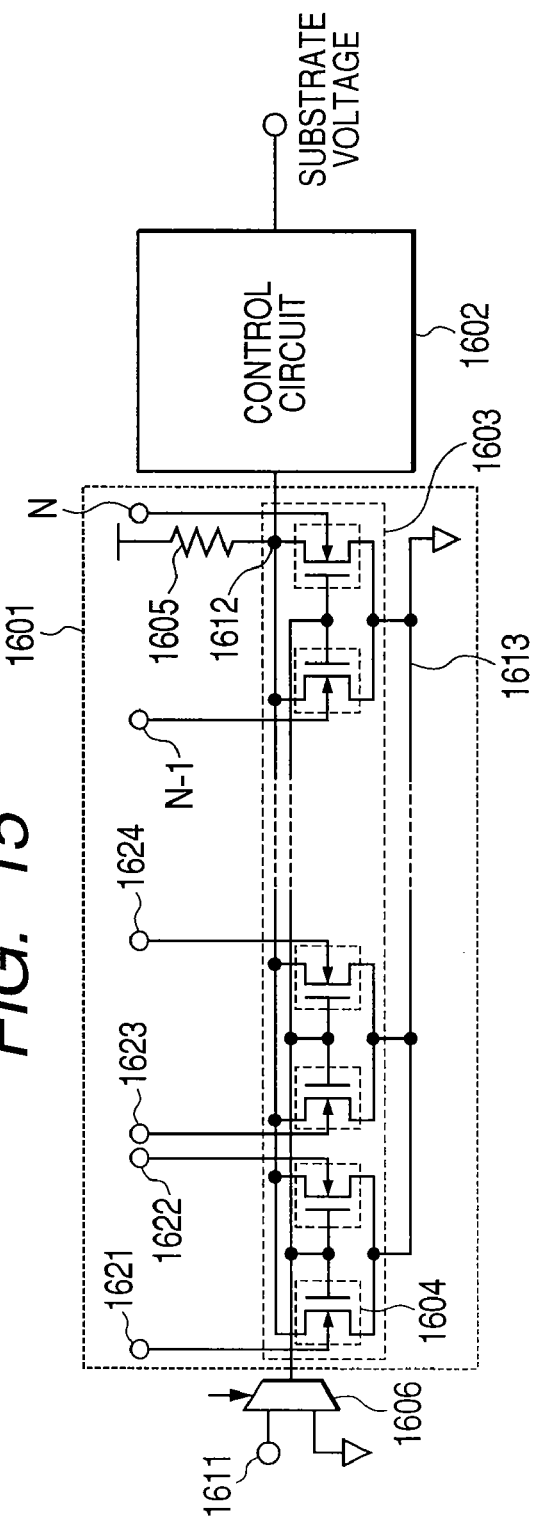
FIG. 15 is a diagram showing an entire NMOS threshold voltage variation control block.

FIG. 15 is a diagram showing the entire block of the NMOS threshold voltage variation control circuit 153. A difference from the NMOS transistor substrate control circuit shown in FIG. 1 resides in that the outputs from the NMOS substrate control circuits within the DRAM chip shown in FIG. 1 are inputted to substrates 1621, 1622, 1623, . . . N of the NMOS transistors. With the above configuration, because a voltage at a node 1612 is determined according to an NMOS transistor array 1603, it is possible to adjust a variation in the entire DRAM chip. In this embodiment, the substrate voltage of the sense amplifier is supplied from not the substrate control circuit shown in FIG. 1 but the threshold voltage variation control circuit 153 shown in this figure.

Figure 16:
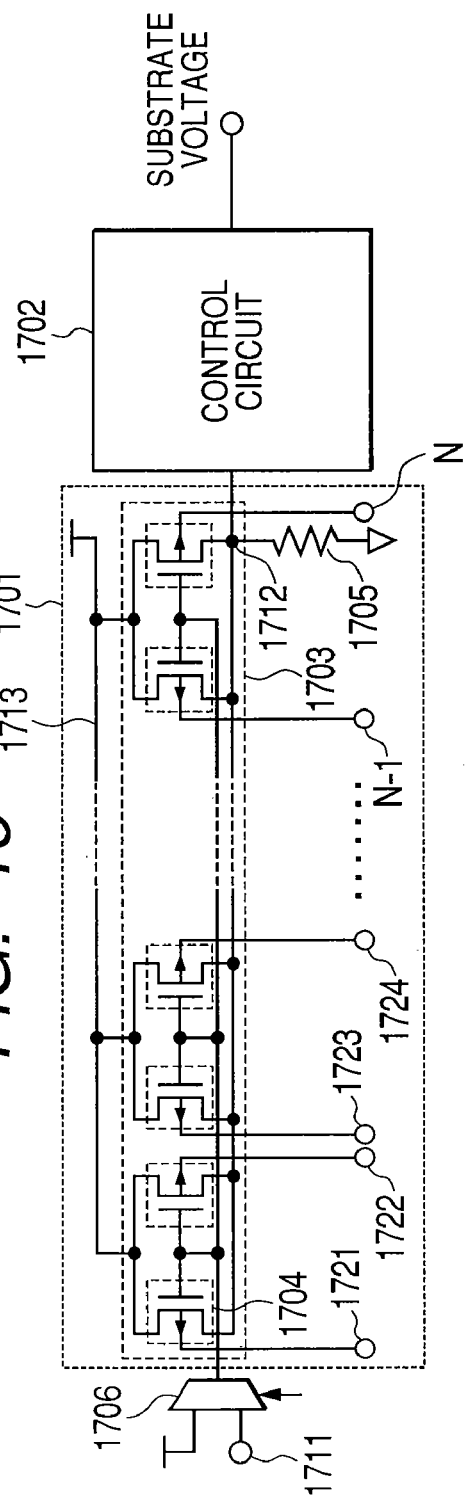
FIG. 16 is a diagram showing an entire PMOS threshold voltage variation control block.

FIG. 16 is a diagram showing the entire block of the PMOS threshold voltage variation control circuit 154. A difference from the PMOS transistor substrate control circuit shown in FIG. 2 resides in that the outputs from the entire PMOS substrate control block within the DRAM chip are inputted to substrates 1721, 1722, 1723, . . . N of the PMOS transistors. Because a voltage at a node 1712 is determined according to a PMOS transistor array 1703, it is possible to adjust a variation in the entire DRAM chip. In this embodiment, the substrate voltage of the sense amplifier is supplied from not the substrate control circuit shown in FIG. 1 but the threshold voltage variation control circuit 153 shown in this figure.

As a result, the threshold voltages that satisfy both of the specifications of the sense speed and the power consumption can be set from the variations of the center values of the respective threshold voltages which are detected by the NMOS/PMOS substrate control blocks that are located in each of the banks or each of the half banks within the DRAM chip by controlling the substrate voltage.

The operation flow in this embodiment is classified into three phases. A first phase is a threshold voltage center value detection phase due to the NMOS/PMOS substrate control block. In the phase, the threshold voltage center value is detected in each of the separated regions (each of banks, each of half banks) within the chip. A second phase is a phase in which the substrate voltage of the sense amplifier NMOS/PMOS transistors of the entire DRAM chip is determined according to the NMOS/PMOS threshold voltage variation control blocks. In the phase, the threshold voltages that are varied in each of the locations of the DRAM chip are determined so as to satisfy the specifications of the sense speed and the power consumption. A third phase is a phase in which the substrate voltage that is determined according to the NMOS/PMOS threshold voltage variation control block is inputted to the NMOS/PMOS transistors of all the sense amplifiers within the DRAM chip to control the threshold voltage. As a result, it is possible to realize the sense amplifier that satisfies the specifications of the sense speed and the power consumption. Unless a desired threshold voltage can be set at one time, the first phase to the third phase are severally repeated to control the threshold voltages.

The present invention described in the present invention and the drawings have been described with reference to the diverse embodiments. However, the present invention can be diversely modified without deviating from the sprit of the invention.

The foregoing description of the preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A semiconductor device comprising:
   a plurality of first MOS transistors of a first conductivity type;
   a first monitoring circuit having a plurality of first replica MOS transistors of the first conductivity type; and
   a first control circuit controlling a substrate voltage of the plurality of first MOS transistors,
   wherein the first monitoring circuit detects a center value of threshold voltages of the plurality of first replica MOS transistors, and outputs a detection result to the first control circuit,
   wherein the first control circuit outputs the substrate voltage of the plurality of first MOS transistors in order to control the threshold voltages of the plurality of first MOS transistors based on the detection result, and
   wherein the first control circuit includes a plurality of comparator circuits that compare an output of the first monitoring circuit with a reference voltage.

2. The semiconductor device according to claim 1 including a plurality of each of said first monitoring and first control circuits.

3. The semiconductor device according to claim 1, wherein the first control circuit includes a power supply circuit that determines the substrate voltage of the plurality of first replica MOS transistors or the plurality of first MOS transistors based on an output from the plurality of comparator circuits.

4. The semiconductor device according to claim 1, wherein the plurality of first replica MOS transistors and the first control circuit are disposed at a periphery of a memory array block.

5. The semiconductor device according to claim 1, wherein the plurality of first replica MOS transistors and the first control circuit are disposed within a memory array block.

6. The semiconductor device according to claim 1, further comprising:
   a plurality of second MOS transistors of a second conductivity type that is different from the first conductivity type;
   a second monitoring circuit having a plurality of second replica MOS transistors of the second conductivity type; and
   a second control circuit that controls a substrate voltage of the plurality of second MOS transistors,
   wherein the second monitoring circuit detects a center value of threshold voltages of the plurality of second replica MOS transistors, and outputs a detection result to the second control circuit, and
   wherein the second control circuit outputs the substrate voltage of the plurality of second MOS transistors in order to control the threshold voltages of the plurality of second MOS transistors based on the detection result.

7. The semiconductor device according to claim 6 including a plurality of each of said second monitoring and second control circuits disposed on a semiconductor integrated circuit chip.

8. The semiconductor device according to claim 7, wherein a variation in the threshold voltages of the plurality of second MOS transistors is detected by the plurality of second replica MOS transistors and the plurality of second control circuits.

9. The semiconductor device according to claim 1, wherein the plurality of first MOS transistors constitute elements of sense amplifiers.

10. A semiconductor device comprising:

a plurality of first MOS transistors of a first conductivity type;

a first MOS transistor substrate control circuit including a first monitoring circuit having a plurality of first replica MOS transistors of the first conductivity type, and a first control circuit that controls substrate voltages of the plurality of first replica MOS transistors; and a second MOS transistor substrate control circuit including a second monitoring circuit having a plurality of second replica MOS transistors of the first conductivity type, and a second control circuit that controls substrate voltages of the plurality of first MOS transistors, wherein the first monitoring circuit detects a center value of threshold voltages of the plurality of first replica MOS transistors and outputs a detection result to the first control circuit, wherein the first control circuit outputs the substrate voltage of each first replica MOS transistor to a corresponding one of the second replica MOS transistors in order to control the threshold voltages of the plurality of first replica MOS transistors based on the detection result, and wherein the second control circuit controls the substrate voltages of the plurality of first MOS transistors based on an output of the second monitoring circuit.

11. The semiconductor device according to claim 10 including a plurality of first MOS transistor substrate control circuits, wherein the second MOS transistor substrate control circuit is disposed in a center of a chip.

12. The semiconductor device according to claim 10, wherein the first control circuit includes a plurality of comparator circuits that compare the output of the first monitoring circuit with a first reference voltage, and wherein the second control circuit includes a plurality of comparator circuits that compare the output of the second monitoring circuit with a second reference voltage.

13. The semiconductor device according to claim 11, wherein the plurality of first replica MOS transistors and the first control circuit of each of the plurality of first MOS transistor substrate control circuits are disposed at a periphery of a memory array block.

14. The semiconductor device according to claim 11, wherein the plurality of first replica MOS transistors and the first control circuit of each of the plurality of first MOS transistor substrate control circuits are disposed within a memory array block.

* * * * *